(12) United States Patent
Han

(10) Patent No.: US 12,097,706 B2
(45) Date of Patent: Sep. 24, 2024

(54) INKJET DEVICE AND PRINTING METHOD OF INKJET DEVICE

(71) Applicant: SAMSUNG DISPLAY CO., LTD., Yongin-si (KR)

(72) Inventor: Jeong Won Han, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 253 days.

(21) Appl. No.: 17/675,377

(22) Filed: Feb. 18, 2022

(65) Prior Publication Data
US 2022/0169026 A1 Jun. 2, 2022

Related U.S. Application Data

(62) Division of application No. 16/743,302, filed on Jan. 15, 2020.

(30) Foreign Application Priority Data

Jun. 13, 2019 (KR) .......................... 10-2019-0069712

(51) Int. Cl.
*B41J 2/165* (2006.01)
*H01L 27/15* (2006.01)
(Continued)

(52) U.S. Cl.
CPC ....... *B41J 2/16508* (2013.01); *B41J 2/16505* (2013.01); *B41J 2/1652* (2013.01);
(Continued)

(58) Field of Classification Search
CPC ................ B41J 2/16505; B41J 2/16508; B41J 2/16517; B41J 2/1652; B41J 2/16523;
(Continued)

(56) References Cited

U.S. PATENT DOCUMENTS 6,565,185 B1 5/2003 Endo
6,582,048 B1 6/2003 Akahira et al.
(Continued)

FOREIGN PATENT DOCUMENTS

CN 1138528 A 12/1996
CN 102452225 A 5/2012
(Continued)

OTHER PUBLICATIONS

Chinese Office Action dated Dec. 23, 2022 issued in corresponding Chinese Application No. 202010428623.4 (6 pages).

*Primary Examiner* — Justin Seo
*Assistant Examiner* — Kendrick X Liu
(74) *Attorney, Agent, or Firm* — Lewis Roca Rothgerber Christie LLP

(57) ABSTRACT

An inkjet device includes a stage, a first suction member, a second suction member, a spray member, and a substrate. The first suction member is at a first side surface of the stage. The second suction member is at a second side surface of the stage. The spray member is configured to store ink and to move above top surfaces of the stage, the first suction member, and the second suction member, the spray member including a body and a nozzle at a side of the body to discharge the ink. The substrate is on the stage in which the ink discharged from the spray member is printed on the substrate.

10 Claims, 29 Drawing Sheets

(51) Int. Cl.
  *H01L 33/44* (2010.01)
  *H10K 59/12* (2023.01)
  *H10K 71/13* (2023.01)
(52) U.S. Cl.
  CPC ....... *B41J 2/16523* (2013.01); *B41J 2/16532* (2013.01); *H01L 27/156* (2013.01); *H01L 33/44* (2013.01); *H10K 59/1201* (2023.02); *H10K 71/135* (2023.02)
(58) Field of Classification Search
  CPC .. B41J 2/16532; H01L 27/153; H01L 27/156; H01L 33/44; H10K 59/12; H10K 59/1201; H10K 71/13; H10K 71/135
  See application file for complete search history.

(56) References Cited

U.S. PATENT DOCUMENTS

| | | | |
|---|---|---|---|
| 8,240,808 B2 | 8/2012 | Sasayama | |
| 8,474,949 B2 | 7/2013 | Kimura et al. | |
| 9,061,503 B2 | 6/2015 | Shinkai | |
| 9,579,898 B2 | 2/2017 | Ochi et al. | |
| 2007/0052749 A1 | 3/2007 | Chen | |
| 2015/0336388 A1* | 11/2015 | Ohnishi | B41J 2/16552 134/184 |
| 2019/0100014 A1 | 4/2019 | Ogawa et al. | |
| 2019/0232689 A1 | 8/2019 | Ohashi et al. | |
| 2020/0338894 A1 | 10/2020 | Marubayashi et al. | |
| 2021/0070041 A1* | 3/2021 | Maruta | B41J 2/16517 |

FOREIGN PATENT DOCUMENTS

| | | |
|---|---|---|
| CN | 103963470 A | 8/2014 |
| CN | 104908419 A | 9/2015 |
| CN | 110092220 A | 8/2019 |
| JP | 2002-079693 A | 3/2002 |
| JP | 2006159110 A * | 6/2006 |
| JP | 2006-264199 A | 10/2006 |
| JP | 2008-188930 A | 8/2008 |
| JP | 4992547 | 8/2012 |
| KR | 10-2008-0050119 | 6/2008 |
| KR | 10-1189616 | 10/2012 |
| TW | 200711863 A | 4/2007 |

* cited by examiner

FIG. 16
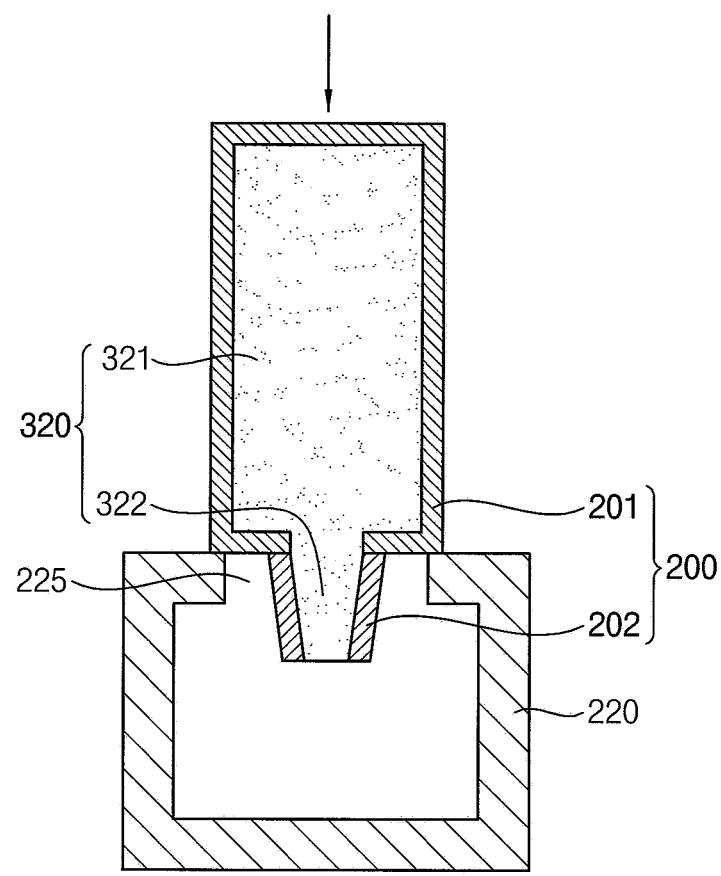
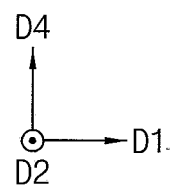

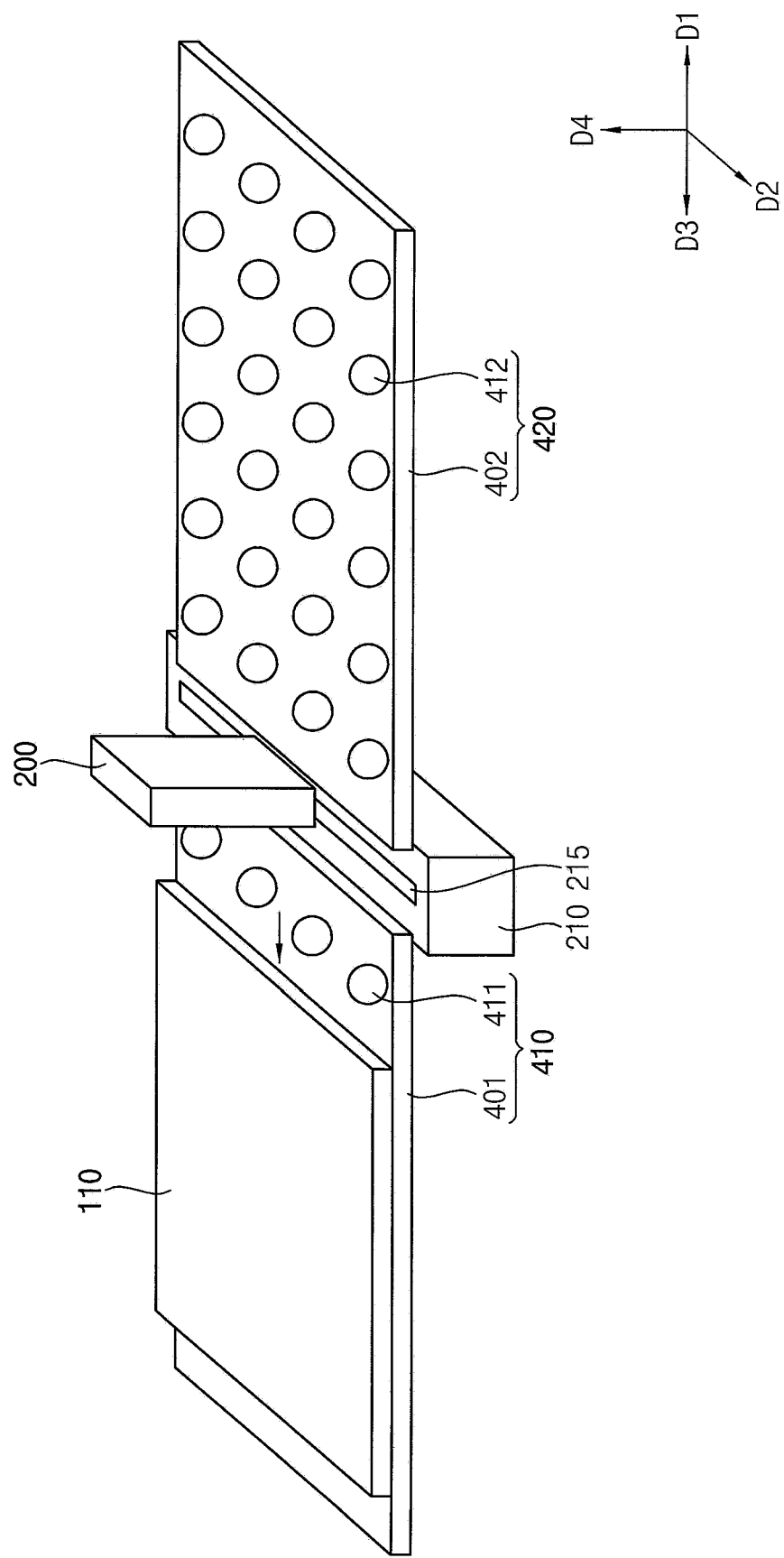

INKJET DEVICE AND PRINTING METHOD OF INKJET DEVICE

CROSS-REFERENCE TO RELATED APPLICATIONS

This application is a divisional of U.S. application Ser. No. 16/743,302, filed on Jan. 15, 2020, which claims priority to and the benefit of Korean Patent Application No. 10-2019-0069712, filed on Jun. 13, 2019 in the Korean Intellectual Property Office (KIPO), the entire disclosures of both of which are incorporated herein by reference.

BACKGROUND

1. Field

One or more embodiments relate generally to an inkjet device and a printing method of an inkjet device.

2. Description of the Related Art

In a process of manufacturing a display device, an organic light emitting layer, a monomer layer of a thin film encapsulation structure, a color filter layer, and the like may be formed through a printing process.

An inkjet device may be used to perform the printing process. The inkjet device may include a spray member including a body for storing ink and a nozzle for discharging the ink, a stage disposed with a substrate thereon, and the like. When the spray member does not perform the printing process while being located at one side above the stage, the ink may not be discharged from the nozzle. In this case, ink located inside the nozzle may be stagnant. A portion of the stagnant ink located inside the nozzle may be exposed to the outside which may cause a solvent of the ink located inside the nozzle to evaporate. Thus a viscosity of the ink located inside the nozzle may increase. If the printing process is not performed for a sufficient period of time, a film may be formed at a portion where the ink located inside the nozzle is exposed. When the viscosity of the ink located inside the nozzle increases or the film is formed, a discharge failure may occur in which the ink located inside the nozzle is not discharged to a portion where the printing process starts on the substrate. In addition, even if the ink located inside the nozzle is discharged, a discharging direction of the ink located inside the nozzle may be distorted, thereby adversely affecting printing accuracy.

SUMMARY

Aspects of one or more embodiments are directed toward an inkjet device for manufacturing a display device.

Aspects of one or more embodiments are directed toward a printing method of an inkjet device for manufacturing a display device.

According to one or more embodiments, an inkjet device includes a stage, a first suction member, a second suction member, a spray member, and a substrate. The first suction member is at a first side surface of the stage. The second suction member is at a second side surface of the stage. The spray member is configured to store ink and to move above top surfaces of the stage, the first suction member, and the second suction member, the spray member including a body and a nozzle at a side of the body to discharge the ink. The substrate is on the stage in which the ink discharged from the spray member is printed on the substrate.

In one or more embodiments, the ink stored in the spray member may include a first ink stored in the body and a second ink located inside the nozzle.

In one or more embodiments, the spray member may discharge the first ink onto the substrate after discharging the second ink to at least one of the first or the second suction member.

In one or more embodiments, the first suction member may include a first groove, the first suction member being configured to suck the second ink discharged from the nozzle into the first groove, and may include a second groove and suck the second ink discharged from the nozzle into the second groove. The first suction member may be opposite the second suction member.

In one or more embodiments, the spray member may be movable along a first path for moving from a position above a first portion of the first suction member to a position above a first portion of the second suction member along a first direction via a first portion of the substrate, a second path for moving from a position above the first portion of the second suction member to a position above a second portion of the second suction member along a second direction orthogonal to the first direction, and a third path for moving from a position above the second portion of the second suction member to a position above a second portion of the first suction member along a third direction opposite to the first direction via a second portion of the substrate.

In one or more embodiments, each length of the first and the second suction members in the second direction may be greater than a length of the spray member in the second direction, and may be equal to a length of the stage in the second direction.

In one or more embodiments, the first suction member may include a first groove, and the second suction member may include a second groove. The spray member is configured to print by discharging ink stored in the body of the spray member onto the substrate after the nozzle of the spray member is located inside the first or second groove, and the first or the second suction members suck ink located inside the nozzle.

In one or more embodiments, each length of the first and the second suction members in a second direction may be greater than a length of the spray member in the second direction, and may be less than a length of the stage in the second direction.

According to one or more embodiments a printing method of an inkjet device is provided as follows. Ink of a spray member is discharged to a first portion of a substrate while the spray member moves in a first direction, in which the spray member includes a body and a nozzle at a side of the body to discharge the ink. The spray member is located above a first portion of a second suction member, and then the spray member is located above a second portion of the second suction member by moving the spray member in a second direction orthogonal to the first direction. Ink located inside the nozzle of the spray member is discharged to a second portion of the second suction member.

In one or more embodiments, the printing method may further include locating the substrate on a stage before discharging the ink of the spray member to the first portion of the substrate and locating the spray member above a first portion of a first suction member.

In one or more embodiments, the printing method may further include discharging ink located inside the nozzle of the spray member to the first portion of the first suction member, after locating the spray member above the first portion of the first suction member.

In one or more embodiments, the ink discharged from the spray member to the first portion of the substrate may be the ink stored in the body of the spray member, while the spray member is moving in the first direction after discharging the ink located inside the nozzle of the spray member.

In one or more embodiments, each length of the first and second suction members in the second direction may be longer than a length of the spray member in the second direction and equal to a length of the stage in the second direction, and the first suction member may be opposite the second suction member.

In one or more embodiments, the printing method may further include discharging ink stored in the body of the spray member to a second portion of the substrate while the spray member is moving in a third direction opposite to the first direction, after discharging ink located inside the nozzle of the spray member to the second portion of the second suction member and locating the spray member above a second portion of a first suction member.

According to one or more embodiments, a printing method of an inkjet device is provided as follows. Ink of a spray member is discharged to a first portion of a substrate while the spray member moves in a first direction, in which the spray member includes a body and a nozzle at a side of the body to discharge the ink. The spray member is located above a second suction member including a second groove. The nozzle of the spray member is located at a position inside of the second groove. Ink located inside the nozzle is sucked by using the second suction member.

In one or more embodiments, the printing method may further include moving the spray member in a second direction orthogonal to the first direction by using the second suction member, after locating the nozzle of the spray member at the position the inside of the second groove.

In one or more embodiments, the printing method may further include discharging ink stored in the body of the spray member to a second portion of the substrate while the spray member is moving in a third direction opposite to the first direction, after sucking the ink located inside the nozzle by utilizing the second suction member.

In one or more embodiments, the printing method may further include locating the substrate on a stage before discharging the ink of the spray member to the first portion of the substrate and locating the spray member above a first suction member including a first groove.

In one or more embodiments, the printing method may further include, after locating the spray member above the first portion of the first suction member including the first groove, locating the nozzle of the spray member at a position inside of the first groove and sucking the ink located inside the nozzle by utilizing the first suction member.

In one or more embodiments, the ink discharged from the spray member to the first portion of the substrate may be the ink stored in the body of the spray member, while the spray member is moving in the first direction after the sucking the ink located inside the nozzle of the spray member.

In one or more embodiments of the present invention, the spray member located above the first portion of the first suction member may discharge the first ink stored in the body to the first portion of the substrate after discharging the second ink located inside the nozzle to the first groove of the first suction member. The spray member located above the second portion of the second suction member may discharge the first ink stored in the body to the second portion of the substrate after discharging the second ink located inside the nozzle to the second groove of the second suction member. Accordingly, the first ink having a predetermined viscosity is discharged to the first and second portions of the substrate, so that the inkjet device may function as a printing device configured to prevent the discharge failure.

In one or more embodiments of the present invention, the first suction member coming into contact (e.g., direct contact) with the spray member may discharge the first ink stored in the body to the first portion of the substrate, after sucking the second ink located inside the nozzle, and the second suction member coming into contact (e.g., direct contact) with the spray member may discharge the first ink stored in the body to the second portion of the substrate, after directly sucking the second ink located inside the nozzle. Accordingly, the first ink having a predetermined viscosity is discharged to the first and second portions of the substrate, so that the inkjet device may function as a printing device configured to prevent the discharge failure.

BRIEF DESCRIPTION OF THE DRAWINGS

One or more embodiments can be understood in more detail from the following description taken in conjunction with the accompanying drawings, in which:

FIGS. 11-21 are views showing a printing method of the inkjet device according to one or more embodiments of the present invention;

FIGS. 23-29 are views showing a printing method of the inkjet device according to one or more embodiments of the present invention.

DETAILED DESCRIPTION

Figure 1:
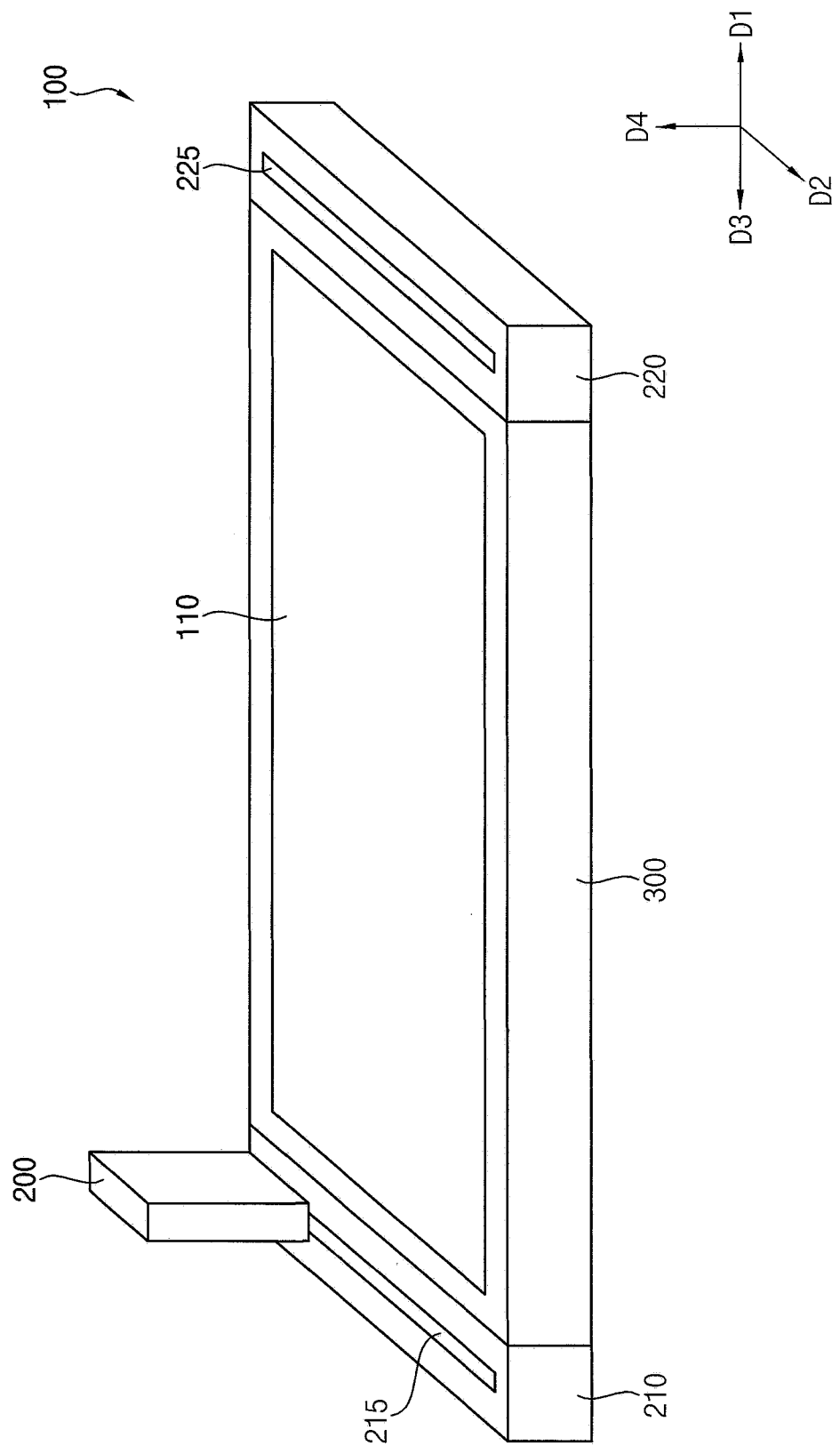
FIG. 1 is a perspective view showing an inkjet device according to one or more embodiments of the present invention.

Hereinafter, inkjet devices and a printing method of an inkjet device according to one or more embodiments of the present invention will be described in more detail with reference to the accompanying drawings. In the accompanying drawings, same or similar reference numerals refer to the same or similar elements.

Figure 2:
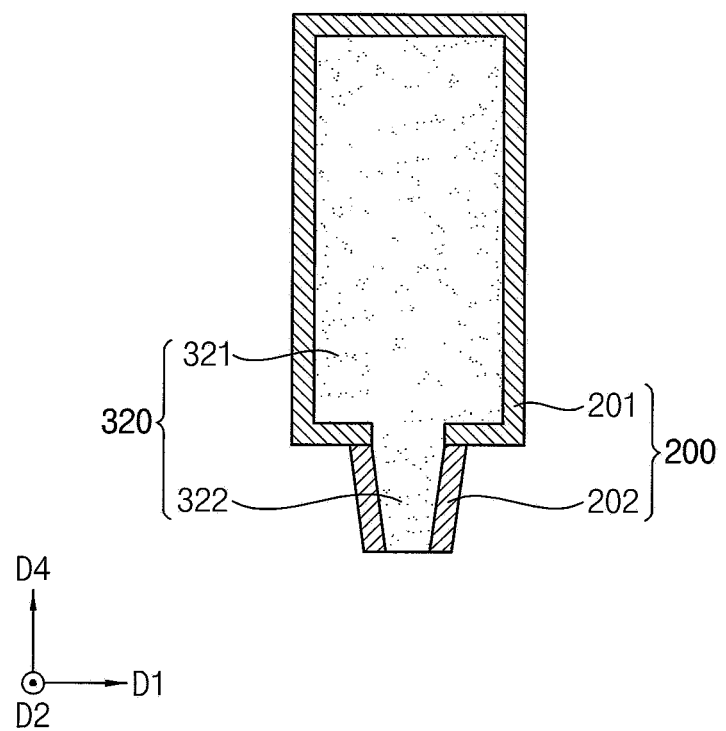
FIG. 2 is a sectional view illustrating a spray member included in the inkjet device of FIG. 1.

FIG. 1 is a perspective view showing an inkjet device according to one or more embodiments of the present invention. FIG. 2 is a sectional view illustrating a spray member included in the inkjet device of FIG. 1.

Referring to FIGS. 1 and 2, the inkjet device 100 may include a stage 300, a substrate 110, a first suction member 210, a second suction member 220, a spray member 200, and the like. The spray member 200 may include a body 201 and a nozzle 202, and ink 320 may be stored in the spray member 200. For example, the ink 320 may include a first ink 321 (e.g., a first portion of ink) stored in the body 201 and a second ink 322 (e.g., a second portion of ink) located inside the nozzle 202.

A substrate 110 including a glass substrate or a plastic substrate may be disposed on the stage 300, and the ink 320 discharged from the spray member 200 may be printed on the substrate 110. The stage 300 may fix the substrate 110, and the stage 300 may also be fixed or stationary. In one or more embodiments, the stage 300 may be connected to a moving member, and the stage 300 may move in a plane direction by the moving member. In this case, the spray member 200 may be fixed or stationary.

The substrate 110 may be a substrate used for a display device. For example, a plurality of semiconductor elements may be disposed on the substrate 110, and a light emitting layer may be formed on the semiconductor elements by using the ink discharged from the spray member 200. In addition, a thin film encapsulation structure may be disposed on the light emitting layer, and a monomer layer of the thin film encapsulation structure may be formed using the ink discharged from the spray member 200. In addition, a color filter used for the display device may be formed using the ink discharged from the spray member 200. Ink used for the light emitting layer, ink used for the monomer layer, and ink used for the color filter may contain materials different from each other.

The first suction member 210 may be located on or at a first side surface of the stage 300. The first suction member 210 may include a first groove 215. The first suction member 210 may suck or store the ink 320 discharged from the spray member 200 (e.g., the second ink 322 located in the nozzle 202) into the first groove 215. In one or more embodiments, a length of the first suction member 210 in a longitudinal direction (e.g., a second direction D2) may be longer (greater) than a length of the spray member 200 in the longitudinal direction, and may be substantially the same as or the same as (equal to) a length of the stage 300 in the longitudinal direction. In one or more embodiments, the first groove 215 may not be formed in the first suction member 210, or the first suction member 210 may have a first opening instead of the first groove 215. In addition, the spray member 200 may not discharge the second ink 322 located in the nozzle 202, and the first suction member 210 may suck the second ink 322 located in the nozzle 202 of the spray member 200. In other words, the first suction member 210 may suck the second ink 322 even though the spray member 200 is not discharging the second ink 322 located in the nozzle 202.

The second suction member 220 may be located on or at a second side surface, which is opposite to the first side surface, of the stage 300. The second suction member 220 may include a second groove 225. The second suction member 220 may suck or store the ink 320 discharged from the spray member 200 (e.g., the second ink 322 located in the nozzle 202) into the second groove 225. In one or more embodiments, a length of the second suction member 220 in the longitudinal direction may be longer (greater) than the length of the spray member 200 in the longitudinal direction, and may be substantially the same as or the same as (equal to) the length of the stage 300 in the longitudinal direction. In addition, the second suction member 220 may be opposite the first suction member 210. In one or more embodiments, the second groove 225 may not be formed in the second suction member 220, or the second suction member 220 may have a second opening instead of the second groove 225. In addition, the spray member 200 may not discharge the second ink 322 located in the nozzle 202, and the second suction member 220 may suck the second ink 322 located in the nozzle 202 of the spray member 200. In other words, the second suction member 220 may suck the second ink 322 even though the spray member 200 is not discharging the second ink 322 located in the nozzle 202.

In one or more embodiments, although the first suction member 210 and the second suction member 220 have been described as being parallel to each other, the configuration of the present invention is not limited thereto. For example, in one or more embodiments, the first suction member 210 and the second suction member 220 may be orthogonal to each other or crossing (e.g., intersecting) each other.

The spray member 200 may be located or moved above a first portion of the first suction member 210. The spray member 200 may be spaced apart from a top surface of the first suction member 210. As shown in FIG. 2, the spray member 200 may include a body 201 and a nozzle 202. One portion of an upper surface of the body 201 may be connected to a moving member, and another portion of the upper surface of the body 201 may be connected to an ink supplying unit. In one or more embodiments, when the ink 320 is discharged to the nozzle 202, ink may be replenished to the body 201 through the ink supply unit.

The spray member 200 may move on top surfaces (e.g., a first plane surface) of the first suction member 210, the stage 300, and the second suction member 220 through the moving member. In one or more embodiments, the spray member 200 may move on the first plane surface in a first direction D1 (e.g., a direction parallel to the top surface of the substrate 110), a second direction D2 orthogonal to or crossing the first direction D1, and a third direction D3 opposite to the first direction D1, but may not move in a fourth direction D4 perpendicular to or crossing the first direction D1, the second direction D2, and the third direction D3. For example, the spray member 200 may have a first path P1 for moving from a position above the first portion of the first suction member 210 to a position above a first portion of the second suction member 220 along the first direction D1 via a first portion of the substrate 110 (see FIGS. 4 and 5), a second path P2 for moving from a position above the first portion of the second suction member 220 to a position above a second portion of the second suction member 220 along the second direction D2 (see FIGS. 5 and 6), and a third path P3 for moving from a position above the second portion of the second suction member 220 to a position above a second portion of the first suction member 210 along the third direction D3 via a second portion of the substrate 110 (see FIGS. 8 and 9). While the spray member 200 moves along the first path P1, the ink 320 discharged from the spray member 200 may be printed on the first portion of the substrate 110. While the spray member 200 moves along the third path P3, the ink 320 discharged from the spray member 200 may be printed on the second portion of the substrate 110.

In one or more embodiments, the spray member 200 located or moved above the first portion of the first suction member 210 may discharge the first ink 321 stored in the body 201 to the first portion of the substrate 110 after discharging the second ink 322 located inside the nozzle 202 to the first groove 215 of the first suction member 210. In addition, the spray member 200 located or moved above the second portion of the second suction member 220 may discharge the first ink 321 stored in the body 201 to the second portion of the substrate 110 after discharging the second ink 322 located inside the nozzle 202 to the second groove 225 of the second suction member 220.

According to a conventional inkjet device, the ink is not discharged from the nozzle while the spray member is located at one side over the stage and does not perform a printing process. In this case, the second ink located inside the nozzle may be stagnant and a portion of the second ink may be exposed to the outside. Thus, a solvent of the second ink may evaporate which may cause a viscosity of the second ink to increase. If the printing process is not performed for a sufficient period of time, a film may be form at a portion where the second ink is exposed from the nozzle. When the viscosity of the second ink increases or the film is formed, a discharge failure may occur in which the second ink is not discharged to a portion where the printing process starts on the substrate. In addition, even if the second ink is discharged, a discharging direction of the second ink may be distorted, thereby failing to print at an accurate printing location.

In one or more embodiments of the present invention, the spray member 200 located or moved above the first portion of the first suction member 210 may discharge the first ink 321 stored in the body 201 to the first portion of the substrate 110 after discharging the second ink 322 located inside the nozzle 202 to the first groove 215 of the first suction member 210. The spray member 200 located or moved above the second portion of the second suction member 220 may discharge the first ink 321 stored in the body 201 to the second portion of the substrate 110 after discharging the second ink 322 located inside the nozzle 202 to the second groove 225 of the second suction member 220. Accordingly, the first ink 321 having a desired (e.g., predetermined) viscosity is discharged to the first and second portions of the substrate 110, so that the inkjet device 100 may function as a printing device configured to prevent or to reduce the discharge failure.

However, in one or more embodiments of the present invention, a shape of the ink 320 stored inside the spray member 200 is not limited to a shape of the ink 320 shown in FIG. 2. For example, in one or more embodiments, the shape of the ink 320 may further include a droplet shape suspended on the nozzle 202. In this case, the ink 320 having the droplet-shape may be defined as a second ink 322.

Figure 3:
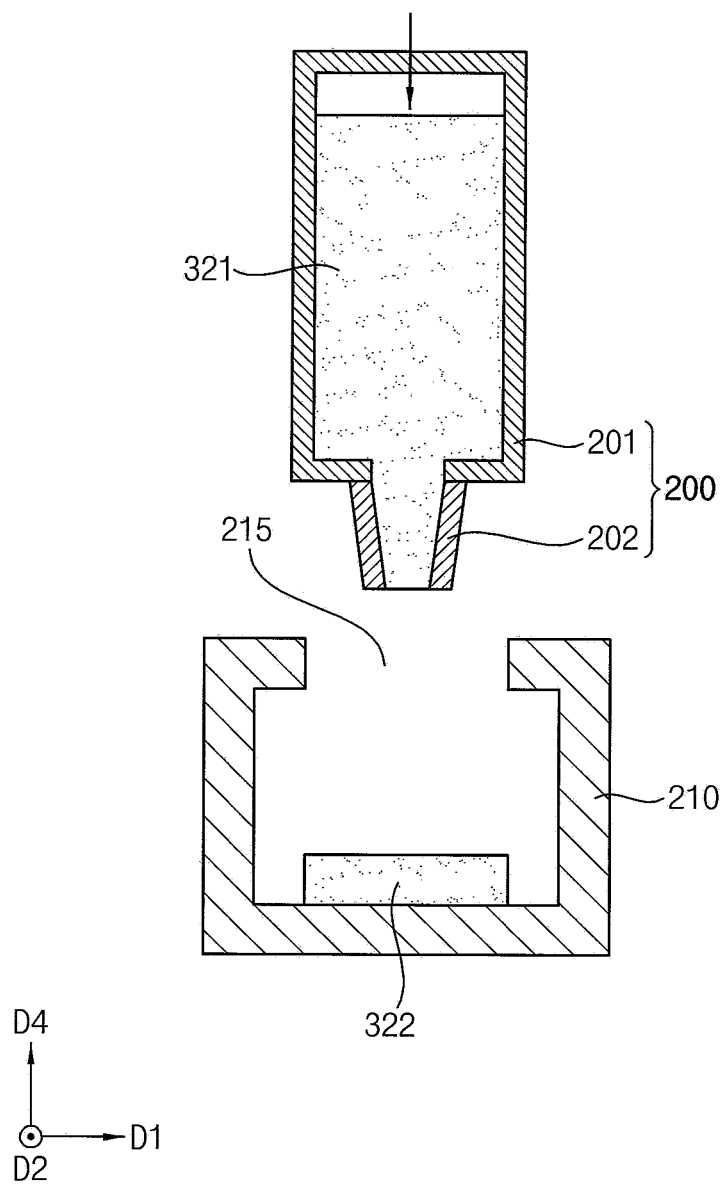
FIGS. 3-9 are views showing a printing method of the inkjet device according to one or more embodiments of the present invention.
Figure 5:
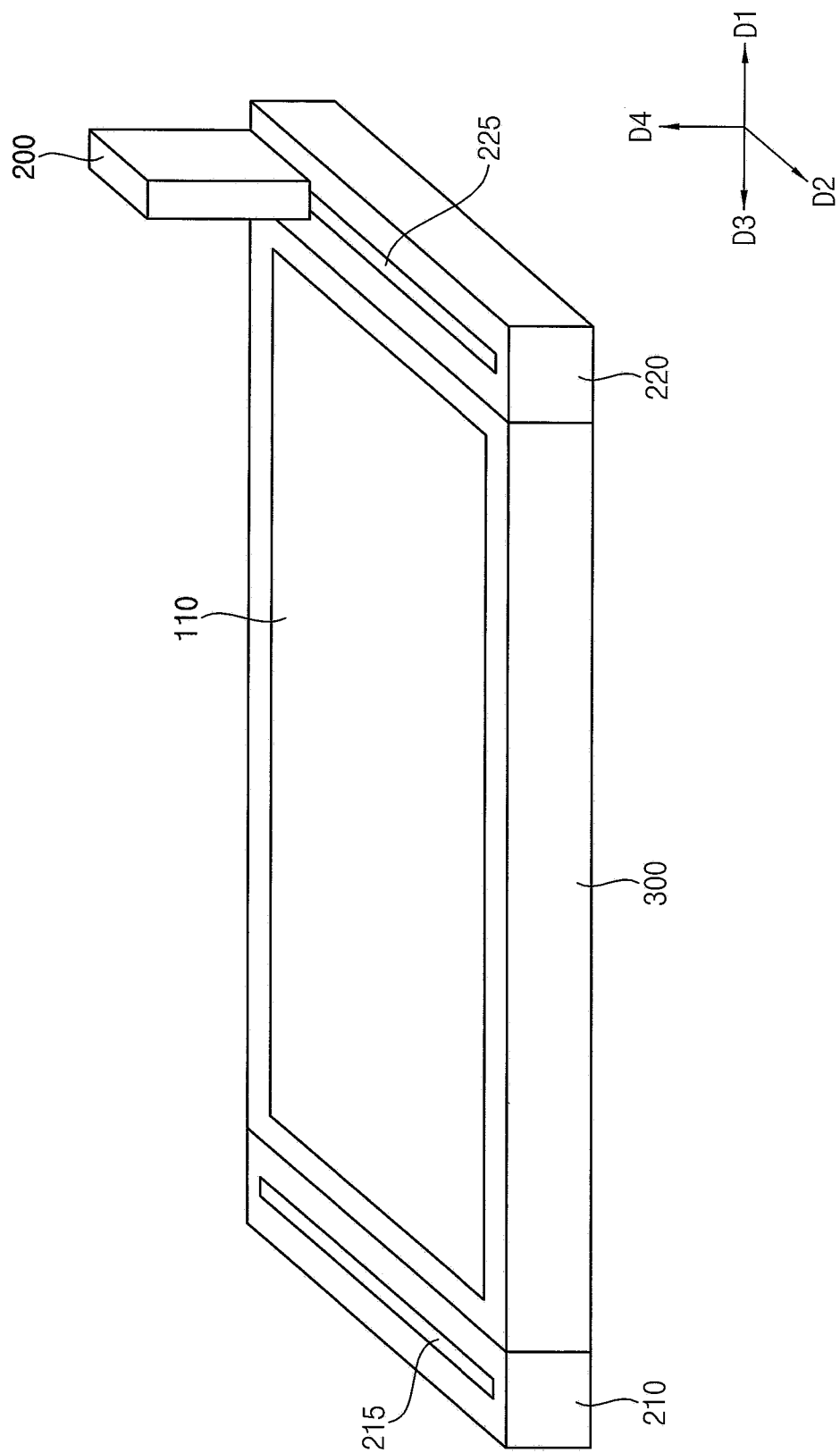
Figure 6:
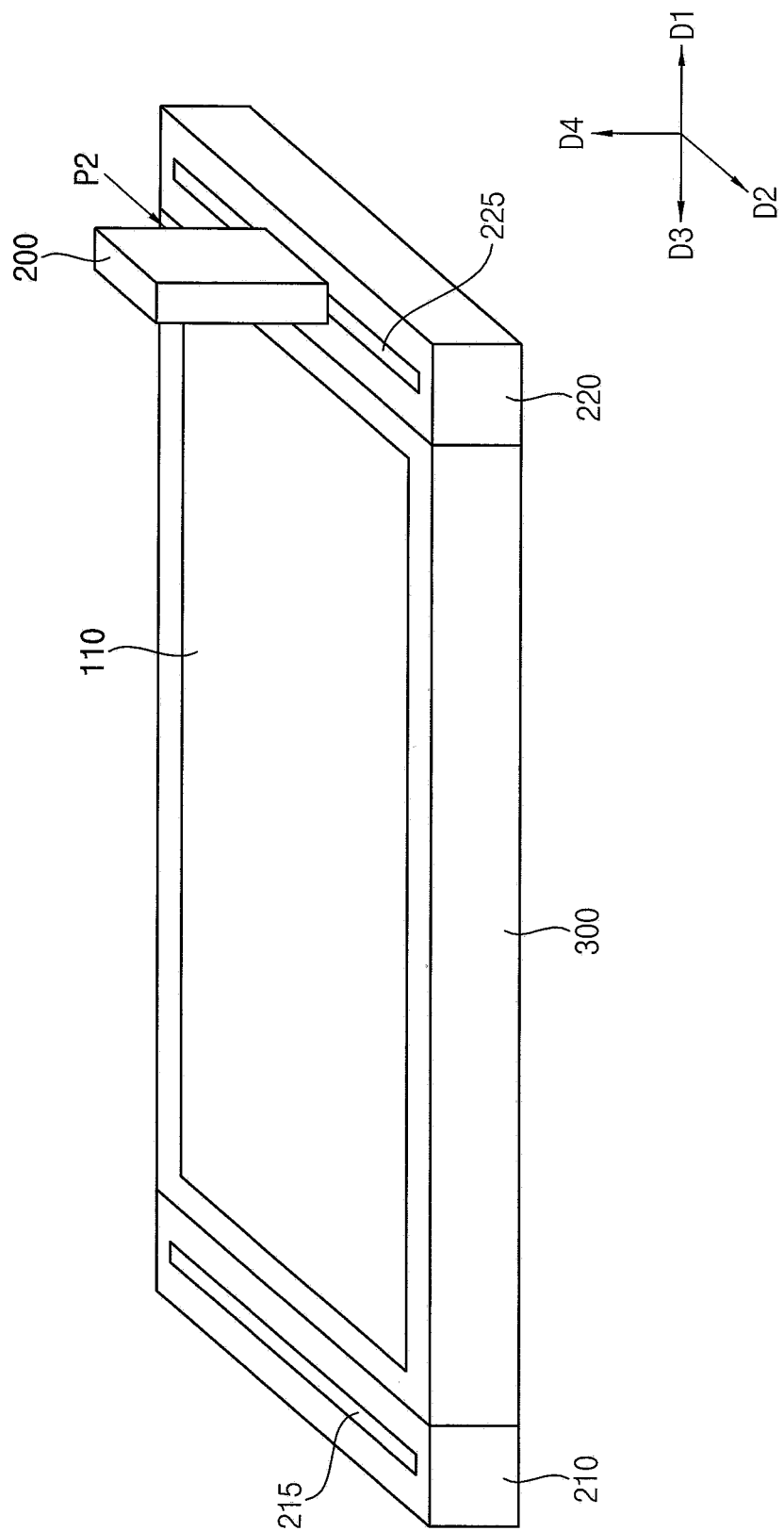
Figure 7:
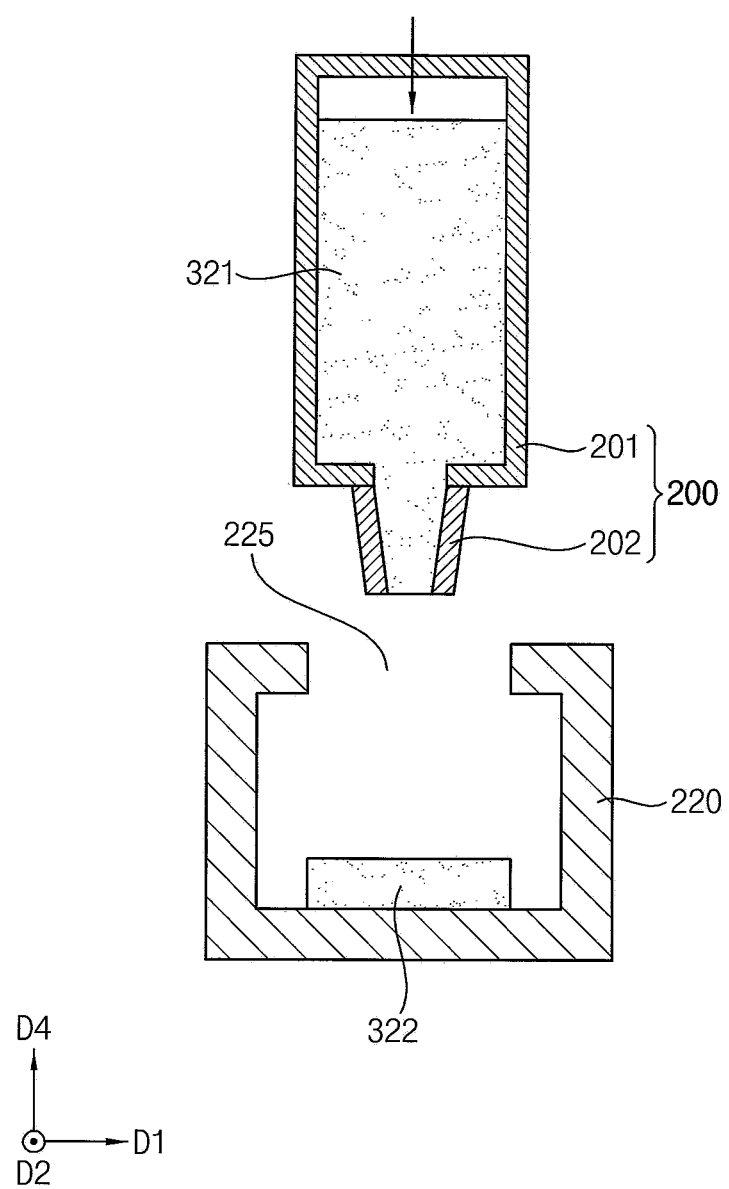

FIGS. 3-9 are views showing a printing method of the inkjet device according to one or more embodiments of the present invention. For example, FIGS. 3 and 7 are sectional views illustrating the spray member and the suction members. FIGS. 4, 5, 6, 8, and 9 are perspective views showing moving paths of the spray member.

Referring to FIGS. 1 and 2, the substrate 110 may be located or placed on the stage 300, and the spray member 200 may be located or moved above a first portion of the first suction member 210. When the spray member 200 is located or moved above the first portion of the first suction member 210, the first ink 321 and the second ink 322 may be stored in the body 201 and the nozzle 202 of the spray member 200, respectively. In one or more embodiments, the act of locating or moving the spray member 200 above the first portion of the first suction member 210 may be defined as an act of not-performing a printing process. In one or more embodiments, a length of the first suction member 210 in a longitudinal direction (e.g., a second direction D2) may be longer (greater) than a length of the spray member 200 in the longitudinal direction, and may be substantially the same as or the same as (equal to) a length of the stage 300 in the longitudinal direction.

Referring to FIGS. 1 and 3, the spray member 200 may discharge the second ink 322 located inside the nozzle 202 to the first groove 215 of the first suction member 210. Accordingly, the second ink 322 discharged from the spray member 200 may be located inside the first suction member 210, and the first ink 321 may be located in the nozzle 202 of the spray member 200. For example, the ink 320 may not be discharged from the nozzle 202 while the printing process is not performed. In this case, the second ink 322 located inside the nozzle 202 may be stagnant and a portion of the second ink 322 may be exposed to the outside. Thus, a solvent of the second ink 322 may evaporate which may cause the viscosity of the second ink 322 to increase. If the printing process is not performed for a sufficient period of time, a film may be form at a portion where the second ink 322 is exposed from the nozzle 302. When the viscosity of the second ink 322 increases or the film is formed, a discharge failure may occur in which the second ink 322 is not discharged to a portion where the printing process starts on the substrate 110. In addition, even if the second ink 322 is discharged, a discharging direction of the second ink 322 may be distorted, thereby failing to print at an accurate printing location. In one or more embodiments, the spray member 200 may discharge the second ink 322 located inside the nozzle 202 to the first groove 215 of the first suction member 210 before the printing process is performed, so that the discharge failure may be prevented or be reduced.

Figure 4:
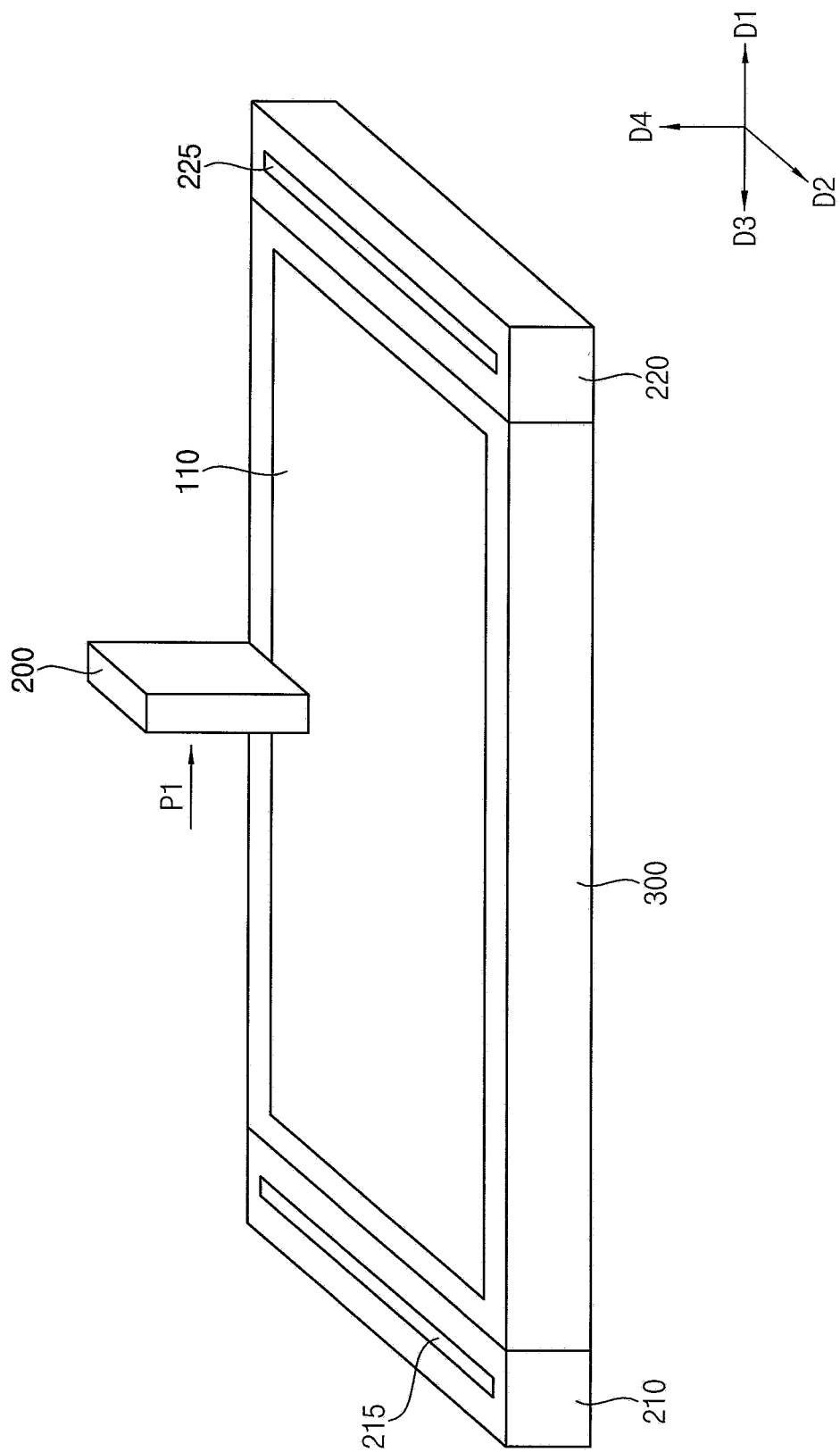

Referring to FIGS. 1, 4 and 5, the spray member 200 may move from a position above the first portion of the first suction member 210 to a position above a first portion of the second suction member 220 along the first direction D1 via a first portion of the substrate 110. The moving path may be defined as a first path P1. While the spray member 200 moves along the first path P1, a first ink 321 stored in the body 201 of the spray member 200 and having a desired (e.g., predetermined) viscosity (e.g., a viscosity lower than a viscosity of the second ink 322) may be discharged to the first portion of the substrate 110. In one or more embodiments, a length of the second suction member 220 in the longitudinal direction may be longer (greater) than a length of the spray member 200 in the longitudinal direction, and may be substantially the same as or the same as (equal to) a length of the stage 300 in the longitudinal direction. In addition, the second suction member 220 may be opposite the first suction member 210.

Referring to FIGS. 5 and 6, after the spray member 200 is located or moved above a first portion of the second suction member 220, the spray member 200 may move in the second direction D2 orthogonal to or crossing the first direction D1, and may be located or moved above the second portion of the second suction member 220. The above moving path may be defined as a second path P2. When the spray member 200 is located or moved above the first portion of the second suction member 220, the first ink 321 and the second ink 322 may be stored in the body 201 and the nozzle 202 of the spray member 200, respectively. In one or more embodiments, the act of locating or moving the spray member 200 above the first and second portions of the second suction member 220 may be defined as an act of not-performing the printing process.

Referring to FIGS. 6 and 7, the spray member 200 may discharge the second ink 322 located inside the nozzle 202 to the second groove 225 of the second suction member 220. Accordingly, the second ink 322 discharged from the spray member 200 may be located inside the second suction member 220, and the first ink 321 may be located in the nozzle 202 of the spray member 200. For example, while the spray member 200 moves from a position above the first portion of the second suction member 220 to a position above the second portion of the second suction member 220 along the second direction D2 the ink 320 may not be discharged from the nozzle 202. In this case, the second ink 322 located inside the nozzle 202 may be stagnant. Thus a solvent of the second ink 322 may evaporate which may cause the viscosity of the second ink 322 to increase. In one or more embodiments, the spray member 200 may discharge the second ink 322 located inside the nozzle 202 to the second groove 225 of the second suction member 220, so that the discharge failure may be prevented or reduced.

Figure 8:
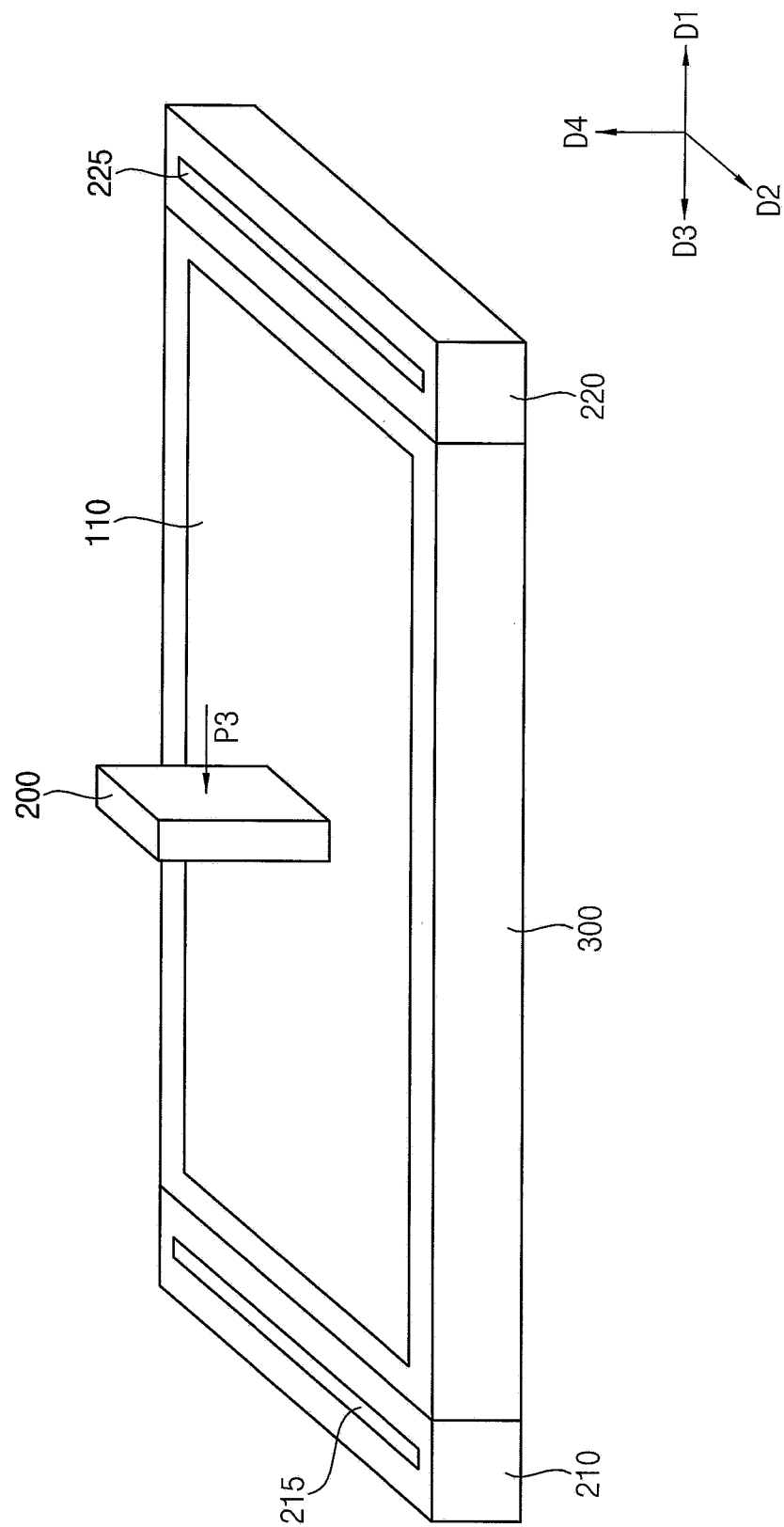
Figure 9:
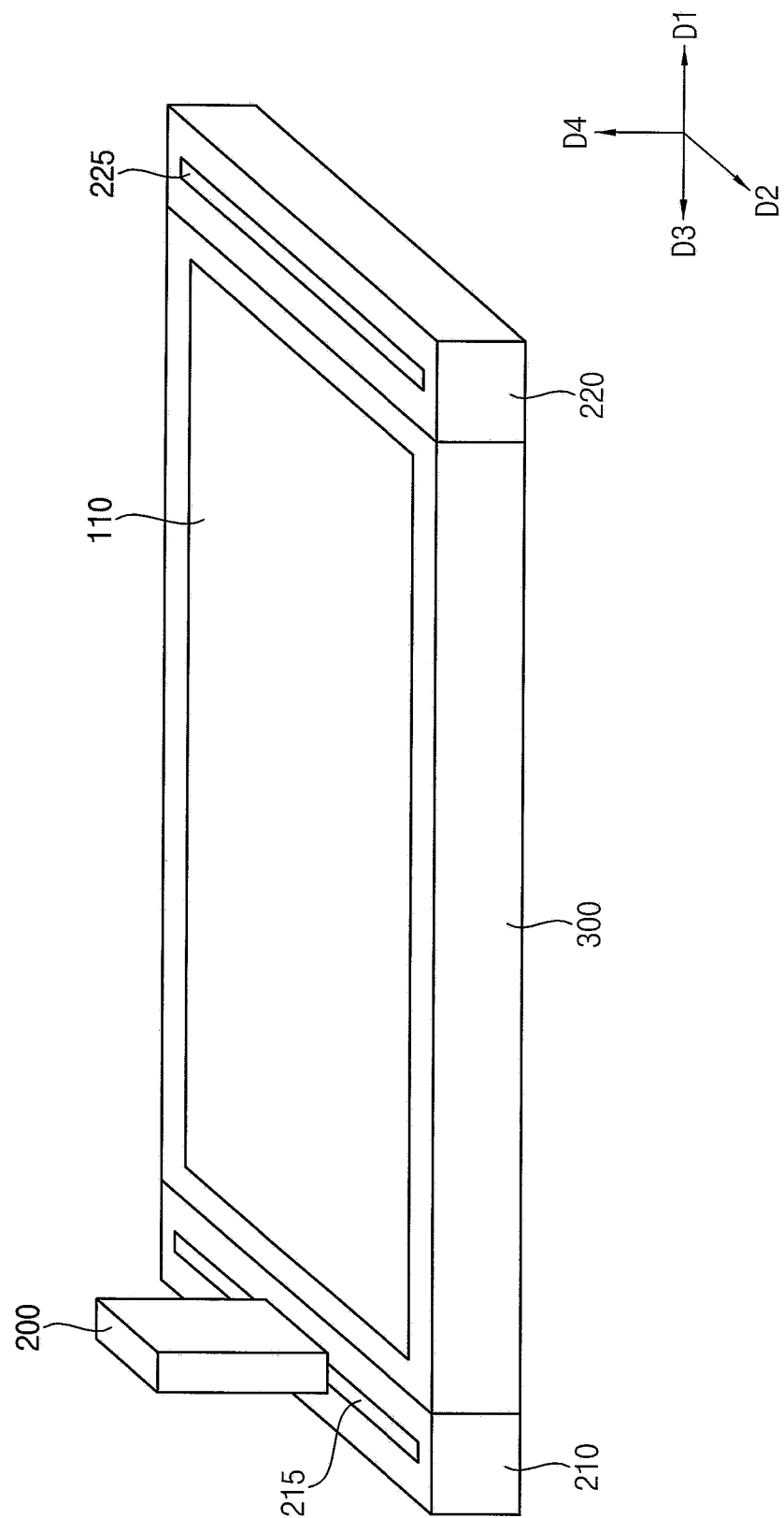

Referring to FIGS. 6, 8 and 9, the spray member 200 may move from a position above the second portion of the second suction member 220 to a position above the second portion of the first suction member 210 along a third direction D3 opposite to the first direction D1 via the second portion of the substrate 110. The moving path may be defined as a third path P3. While the spray member 200 moves along the third path P3, the first ink 321 stored in the body 201 of the spray member 200 and having the desired (e.g., predetermined) viscosity may be discharged to the second portion of the substrate 110.

In the above manner, the spray member 200 may perform the printing process entirely on the substrate 110, and the discharge failure may not occur during performing (performance of) the printing process.

Figure 10:
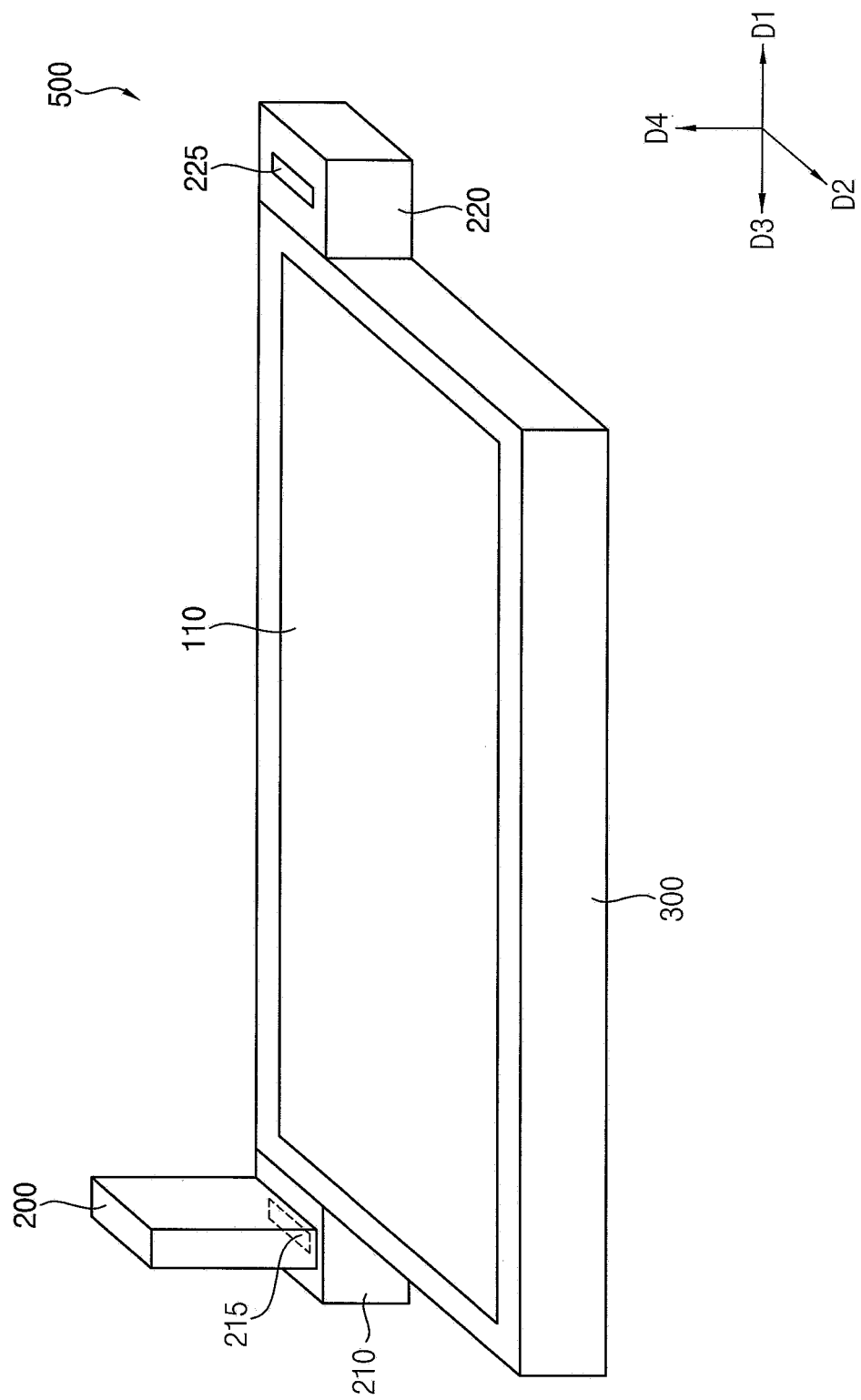
FIG. 10 is a perspective view showing an inkjet device according to one or more embodiments of the present invention.

FIG. 10 is a perspective view showing the inkjet device according to one or more embodiments of the present invention. The inkjet device 500 illustrated in FIG. 10 may have a configuration substantially the same as or similar to the inkjet device 100 described with reference to FIGS. 1 and 2, except for the shapes of the first suction member 210 and the second suction member 220. In FIG. 10, duplicate descriptions may be omitted for components substantially the same as or similar to the components described with reference to FIGS. 1 and 2.

Referring to FIGS. 2 and 10, the inkjet device 500 may include a stage 300, a substrate 110, a first suction member 210, a second suction member 220, a spray member 200, and the like. The spray member 200 may include a body 201 and a nozzle 202, and ink 320 may be stored in the spray member 200. For example, the ink 320 may include first ink 321 stored in the body 201 and second ink 322 located inside the nozzle 202.

A substrate 110 including a glass substrate or a plastic substrate may be disposed on the stage 300, and the ink 320 discharged from the spray member 200 may be printed on the substrate 110. The stage 300 may fix the substrate 110, and the stage 300 may also be fixed or stationary. In one or more embodiments, the stage 300 may be connected to a moving member, and the stage 300 may move in the plane direction by the moving member. In this case, the spray member 200 may be fixed or stationary.

The first suction member 210 may be located on or at a first side surface of the stage 300. The first suction member 210 may include a first groove 215. In one or more embodiments, the first suction member 210 may move on a first side surface of the stage 300 in the longitudinal direction (e.g., the second direction D2). The nozzle 202 of the spray member 200 may be located inside (e.g., at a position inside) the first groove 215, and the spray member 200 may come into contact (e.g., direct contact) with the first suction member 210. For example, the first suction member 210 may function as a moving member for moving the spray member 200 above the first side surface of the stage 300 in the second direction D2. In addition, the first suction member 210 may suck the second ink 322 located in the nozzle 202 of the spray member 200. In addition, a length of the first suction member 210 in a longitudinal direction (e.g., the second direction D2) may be longer (greater) than a length of the spray member 200 in the longitudinal direction, and may be shorter (less) than a length of the stage 300 in the second direction D2. In one or more embodiments, the first suction member 210 may have a first opening instead of the first groove 215. In addition, the first suction member 210 may come into contact (e.g., direct contact) with the spray member 200 and not suck the second ink 322 located in the nozzle 202 of the spray member 200. Instead, the spray member 200 may discharge the second ink 322 located in the nozzle 202 so that the second ink 322 may be stored in the first groove 215.

The second suction member 220 may be located on or at a second side surface, which is opposite to the first side surface, of the stage 300. The second suction member 220 may include a second groove 225. In one or more embodiments, the second suction member 210 may move on the second side surface of the stage 300 in the second direction D2.

The nozzle 202 of the spray member 200 may be located inside (e.g., at a position inside) the second groove 225, and the spray member 200 may come into contact (e.g., direct contact) with the second suction member 220. For example, the second suction member 220 may function as a moving member for moving the spray member 200 above the second side surface of the stage 300 in the second direction D2. In addition, the second suction member 220 may suck the second ink 322 located in the nozzle 202 of the spray member 200. In addition, a length of the second suction member 220 in the second direction D2 may be longer (greater) than a length of the spray member 200 in the second direction D2, and may be shorter (less) than a length of the stage 300 in the second direction D2. The second suction member 220 may be opposite the first suction member 210. In one or more embodiments, the second suction member 210 may have a second opening instead of the second groove 225. In addition, the second suction member 220 may come into contact (e.g., direct contact) with the spray member 200 and not suck the second ink 322 located in the nozzle 202 of the spray member 200. Instead, the spray member 200 may discharge the second ink 322 located in the nozzle 202 so that the second ink 322 may be stored in the second groove 225. The nozzle 202 of the spray member 200 may be located inside (e.g., at a position inside) the first groove 215 of the first suction member 210 (see FIG. 11). The spray member 200 may come into contact (e.g., direct contact) with a top surface of the first suction member 210. As shown in FIG. 2, the spray member 200 may include a body 201 and a nozzle 202. One portion of an upper surface of the body 201 may be connected to a moving member, and another portion of the upper surface of the body 201 may be connected to an ink supplying unit. In one or more embodiment, when the ink 320 is discharged to the nozzle 202, ink may be replenished to the body 201 through the ink supply unit.

Figure 13:
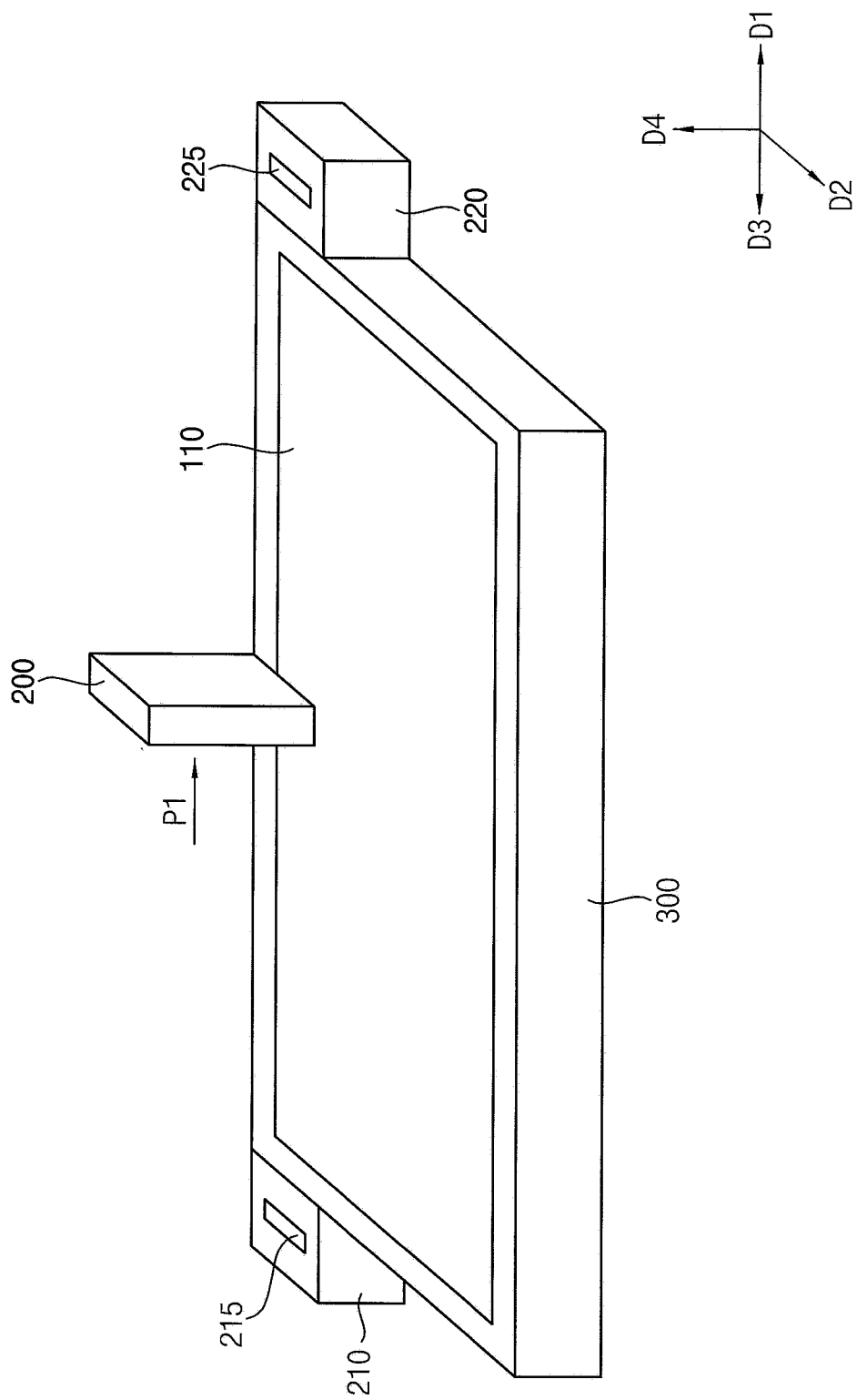

The spray member 200 may move in the fourth direction D4 such that the spray member 200, which comes into contact (e.g., direct contact) with the first suction member 210 through the moving member connected to the spray member 200, may be spaced apart from the first suction member 210, and the spray member 200 may move above top surfaces (e.g., a first plane) of the first suction member 210, the stage 300, and the second suction member 220. In one or more embodiments, the spray member 200 may move on the first plane surface in the first direction D1, the third direction D3, and the fourth direction D4, but may not move in the second direction D2. For example, the spray member 200 may have a first path P1 for moving from a position above the first suction member 210 to a position above the second suction member 220 along the first direction D1 via the first portion of the substrate 110 (see FIGS. 13 and 14), a second path P2 for moving along the second direction D2 while coming into contact (e.g., direct contact) with the second suction member 220 (see FIGS. 14 and 17), and a third path P3 for moving from a position above the second suction member 220 to a position above the first suction member 210 along the third direction D3 via the second portion of the substrate 110 (see FIGS. 20 and 21). While the spray member 200 moves along the first path P1, the ink 320 discharged from the spray member 200 may be printed on the first portion of the substrate 110. While the spray member 200 moves along the third path P3, the ink 320 discharged from the spray member 200 may be printed on the second portion of the substrate 110.

In one or more embodiments, the spray member 200 may discharge the first ink 321 stored in the body 201 to the first portion of the substrate 110, after the first suction member 210 comes into contact (e.g., direct contact) with the spray member 200 and the first suction member 210 sucks the second ink 322 located inside the nozzle 202. In addition, the spray member 200 may discharge the first ink 321 stored in the body 201 to the second portion of the substrate 110, after the second suction member 220 comes into contact (e.g., direct contact) with the spray member 200 and the second suction member 220 directly sucks the second ink 322 located inside the nozzle 202.

Accordingly, the first ink 321 having a desired (e.g., predetermined) viscosity is discharged to the first and second portions of the substrate 110, so that the inkjet device 500 may function as a printing device configured to prevent or to reduce the discharge failure.

FIGS. 11-21 are views showing a printing method of the inkjet device according to one or more embodiments of the present invention. For example, FIGS. 11, 12, 15, 16, 18, and 19 are sectional views illustrating the spray member and the suction members. FIGS. 13, 14, 17, 20, and 21 are perspective views showing moving paths of the spray member.

Referring to FIGS. 2 and 10, the substrate 110 may be located or placed on the stage 300, and the spray member 200 (e.g., a portion of the spray member 200) may be located inside (e.g., at a position inside) the first groove 215 of the first suction member 210. When the spray member 200 is located inside (e.g., at a position inside) the first groove 215 of the first suction member 210, the first ink 321 and the second ink 322 may be stored in the body 201 and the nozzle 202 of the spray member 200, respectively. In one or more embodiments, the act of locating or moving the spray member 200 inside the first groove 215 may be defined as not-performing a printing process. In one or more embodiments, a length of the first suction member 210 in a longitudinal direction (e.g., a second direction D2) may be longer (greater) than a length of the spray member 200 in the longitudinal direction, and may be shorter (less) than a length of the stage 300 in the longitudinal direction.

Figure 11:
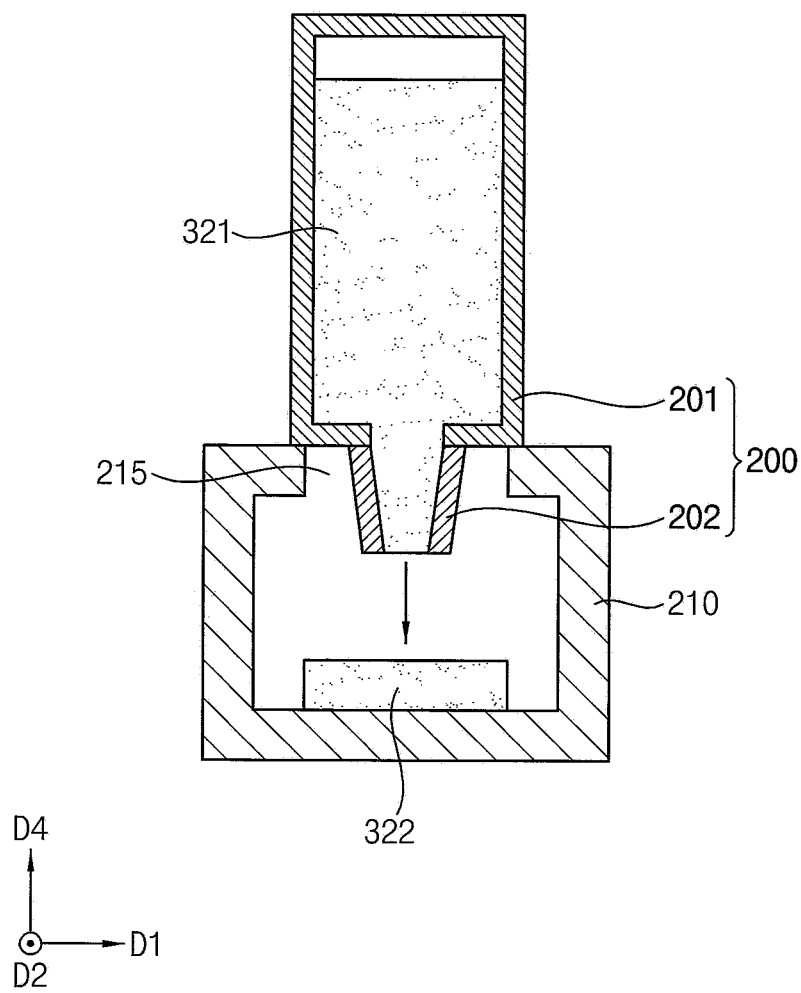

Referring to FIGS. 10 and 11, the first suction member 210 may suck the second ink 322 located in the nozzle 202 of the spray member 200. Accordingly, the second ink 322 discharged from the spray member 200 may be located inside the first suction member 210, and the first ink 321 may be located in the nozzle 202 of the spray member 200. In one or more embodiments, the ink 320 may not be discharged from the nozzle 202 while the printing process is not performed. In this case, the second ink 322 located inside the nozzle 202 may be stagnant and a portion of the second ink 322 may be exposed to the outside. Thus, a solvent of the second ink 322 may evaporate which may cause the viscosity of the second ink 322 to increase. If the printing process is not performed for a sufficient period of time, a film may be form at a portion where the second ink 322 is exposed from the nozzle 302. When the viscosity of the second ink 322 increases or the film is formed, a discharge failure may occur in which the second ink 322 is not discharged to a portion where the printing process starts on the substrate 110. In addition, even if the second ink 322 is discharged, a discharging direction of the second ink 322 may be distorted, thereby failing to print at an accurate printing location. In one or more embodiments, the first suction member 210 may suck the second ink 322 located inside the nozzle 202 before the printing process is performed, so that the discharge failure may be prevented or be reduced.

Figure 12:
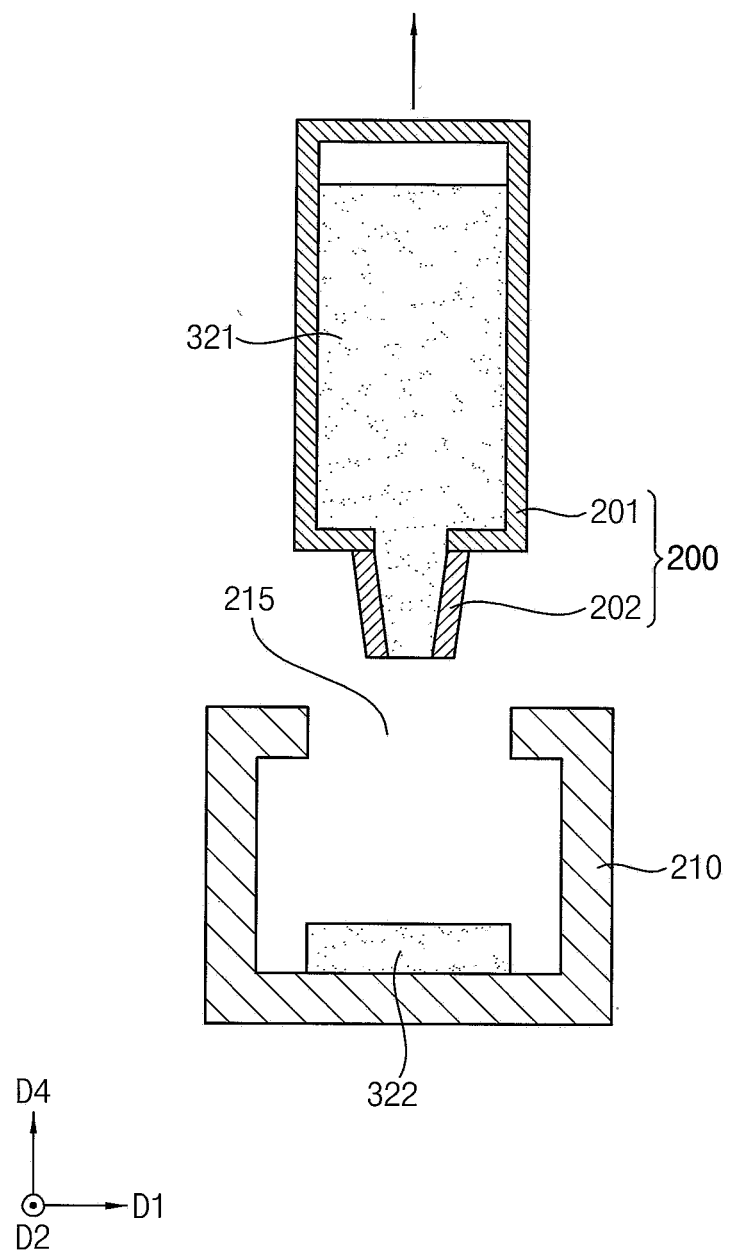

Referring to FIG. 12, the spray member 200 may be spaced apart from a top surface of the first suction member 210. For example, the spray member 200 may move in the fourth direction D4 such that the spray member 200, which comes into contact (e.g., direct contact) with the first suction member 210 through the moving member connected to the spray member 200, may be spaced apart from the first suction member 210.

Referring to FIGS. 10, 13, 14, and 15, the spray member 200 may move from a position above the first suction member 210 to a position above the second suction member 220 along the first direction D1 via the first portion of the substrate 110. The moving path may be defined as a first path P1. While the spray member 200 moves along the first path P1, a first ink 321 stored in the body 201 of the spray member 200 and having a desired (e.g., predetermined) viscosity (e.g., a viscosity lower than a viscosity of the second ink 322) may be discharged to the first portion of the substrate 110. In one or more embodiments, a length of the second suction member 220 in the longitudinal direction may be longer (greater) than a length of the spray member 200 in the longitudinal direction, and may be shorter (less) than a length of the stage 300 in the longitudinal direction. In addition, the second suction member 220 may be opposite the first suction member 210.

Figure 14:
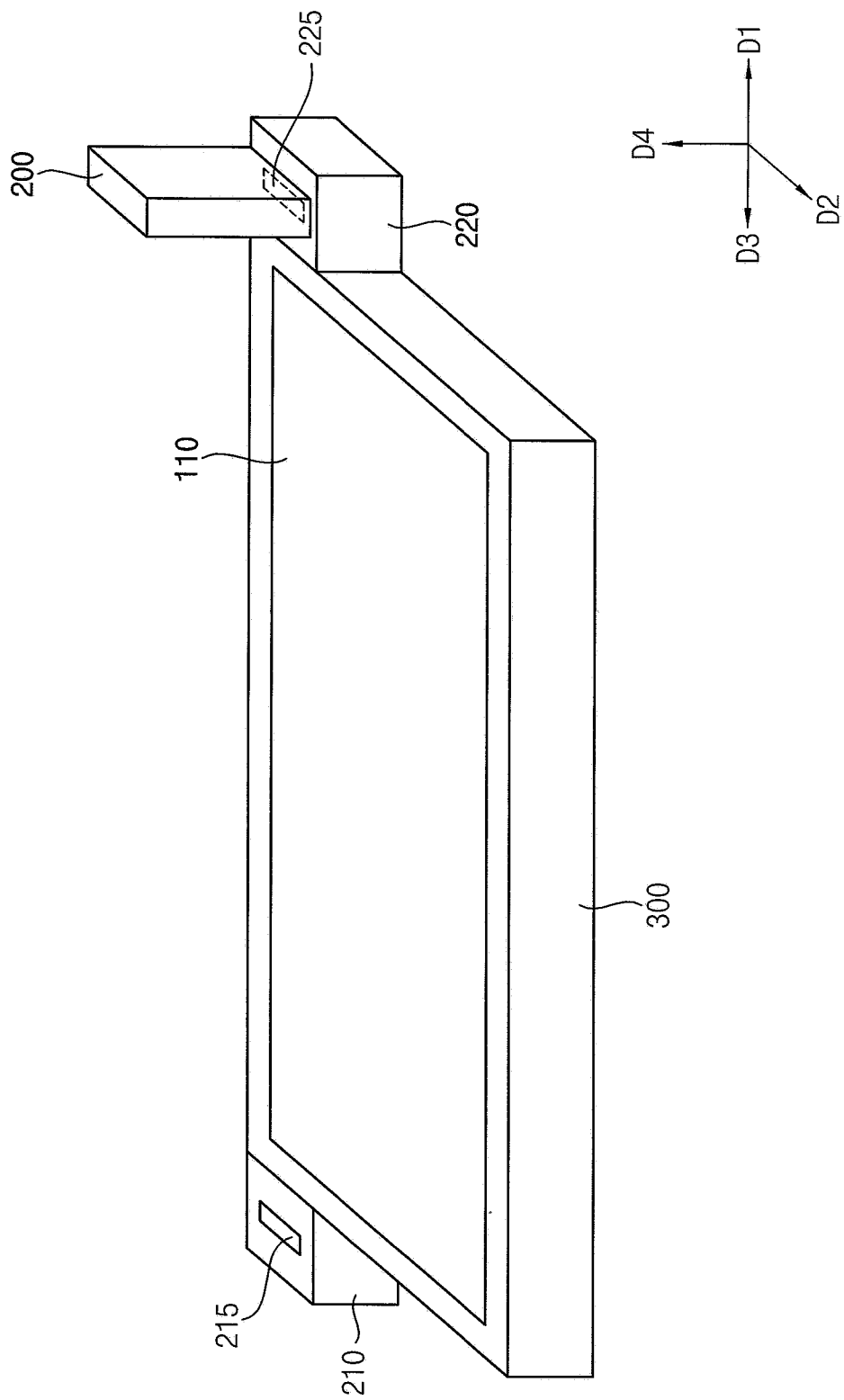
Figure 15:
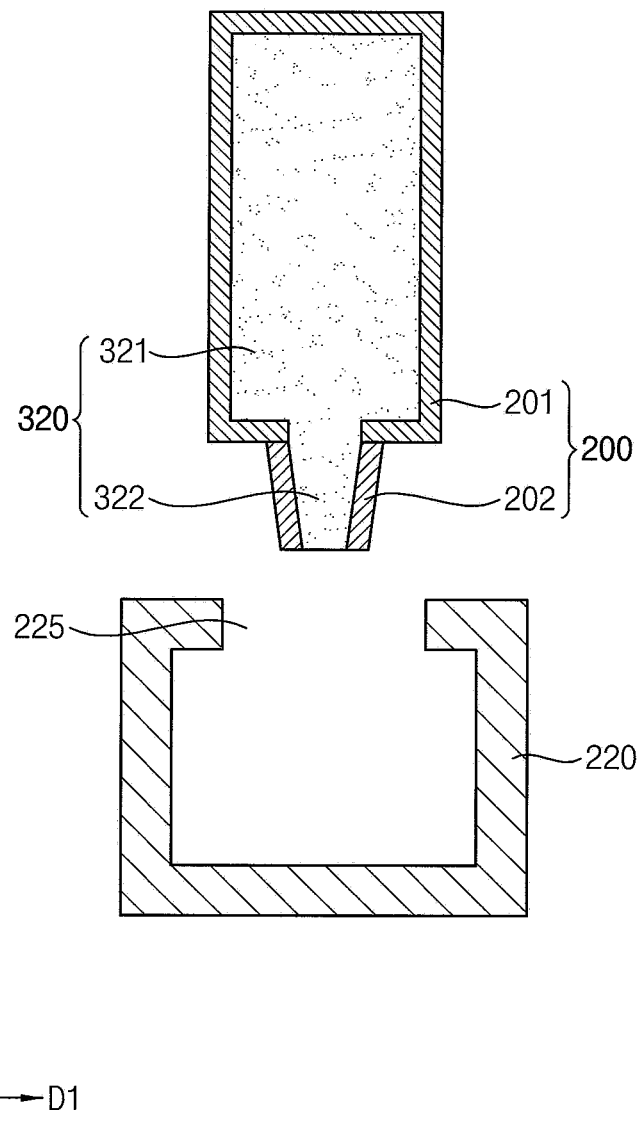

Referring to FIGS. 14 and 16, the spray member 200 (e.g., a portion of the spray member 200) may be located inside (e.g., at a position inside) the first groove 215 of the first suction member 210. For example, the spray member 200 may move in a direction opposite to the fourth direction D4 through the moving member connected to the spray member 200, such that the spray member 200 may come into contact (e.g., direct contact) with a top surface of the second suction member 220.

Figure 17:
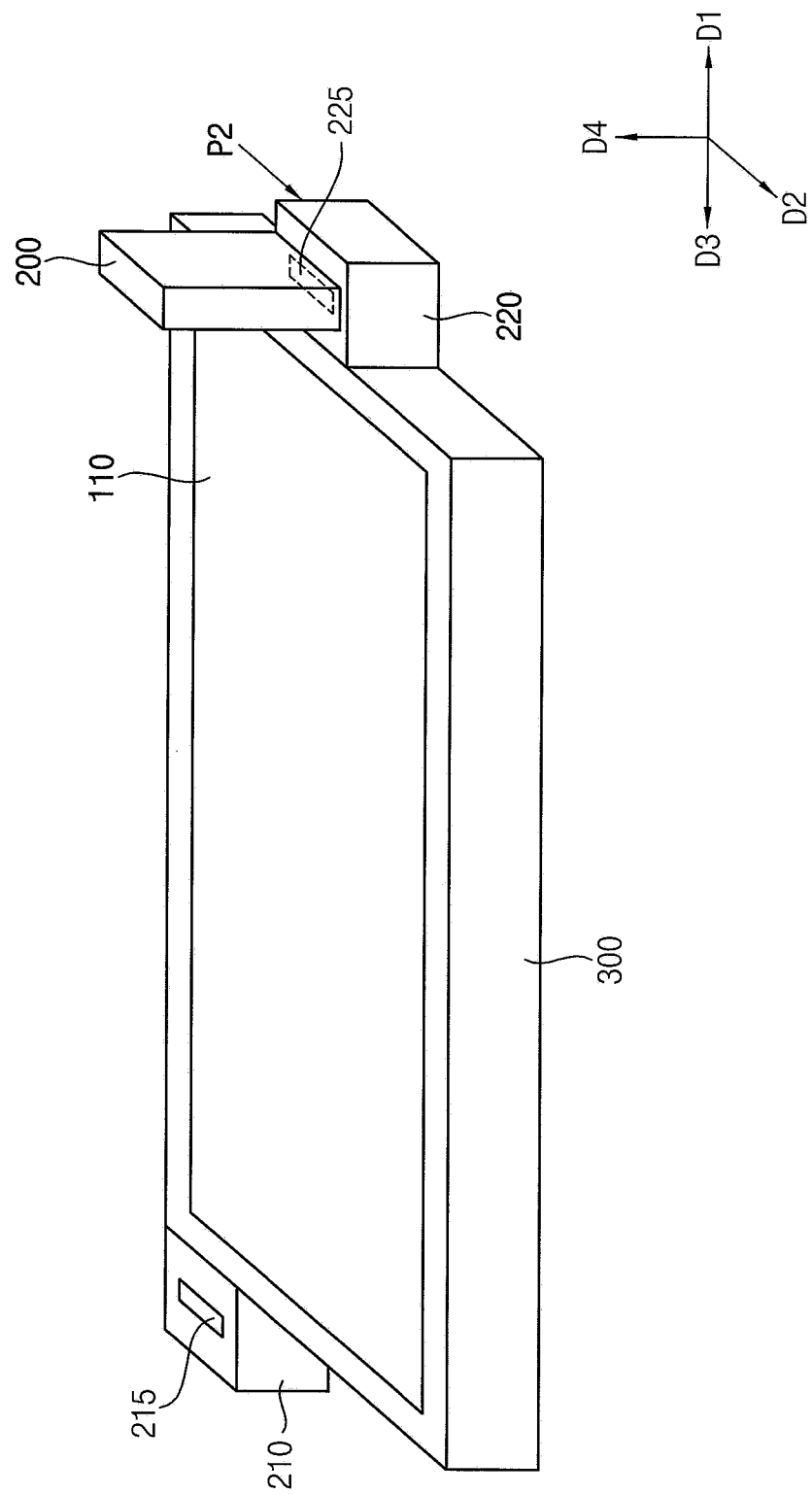

Referring to FIGS. 14 and 17, the spray member 200 may come into contact (e.g., direct contact) with the second suction member 220 and may move along the second direction D2. The above moving path may be defined as a second path P2. For example, the second suction member 220 may function as a moving member for moving the spray member 200 above the second side surface of the stage 300 in the second direction D2. When the spray member 200 (e.g., a portion of the spray member 200) is located inside (e.g., a position inside) the second groove 225 of the second suction member 220, the first ink 321 and the second ink 322 may be stored in the body 201 and the nozzle 202 of the spray member 200, respectively. In one or more embodiments, the act of locating or moving the spray member 200 inside the second groove 225 may be defined as not-performing a printing process.

Figure 18:
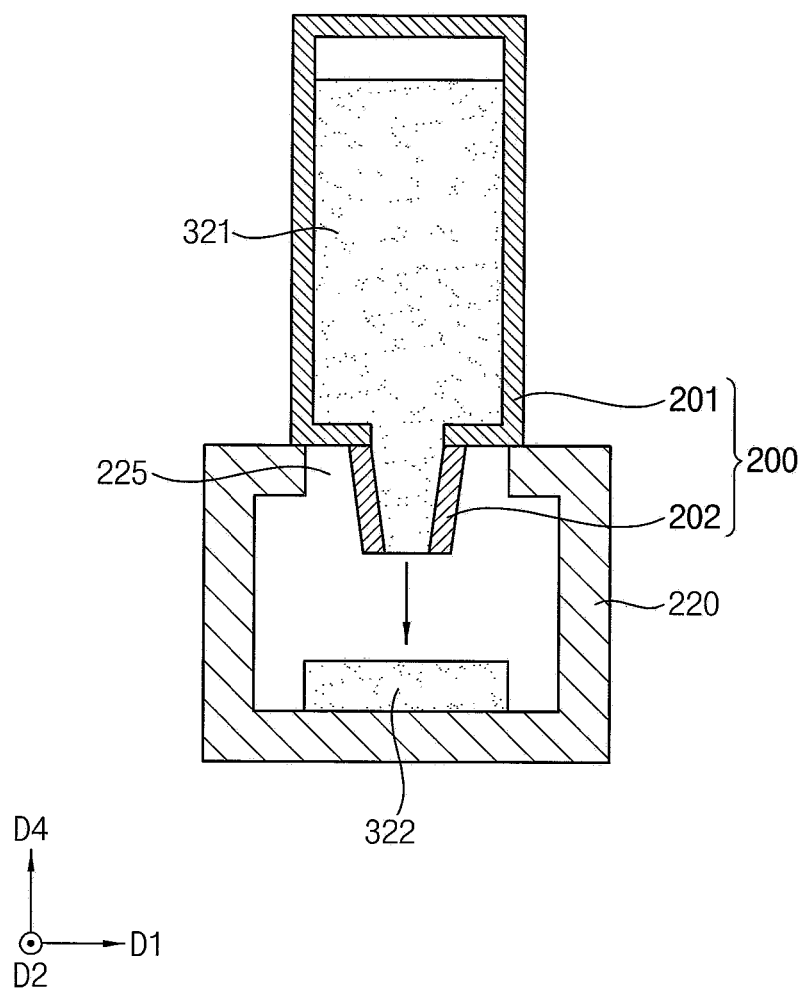

Referring to FIGS. 17 and 18, the second suction member 220 may suck the second ink 322 located in the nozzle 202 of the spray member 200. Accordingly, the second ink 322 discharged from the spray member 200 may be located inside the second suction member 220, and the first ink 321 may be located in the nozzle 202 of the spray member 200.

For example, while the spray member 200 comes into contact (e.g., direct contact) with the second suction member 220 and moves in the second direction D2, the ink 320 may not be discharged from the nozzle 202. In this case, the second ink 322 located inside the nozzle 202 may be stagnant. Thus, a solvent of the second ink 322 may evaporate which may cause the viscosity of the second ink 322 to increase. In one or more embodiments, the second suction member 220 may suck the second ink 322 located inside the nozzle 202, so that the discharge failure may be prevented or be reduced.

Figure 19:
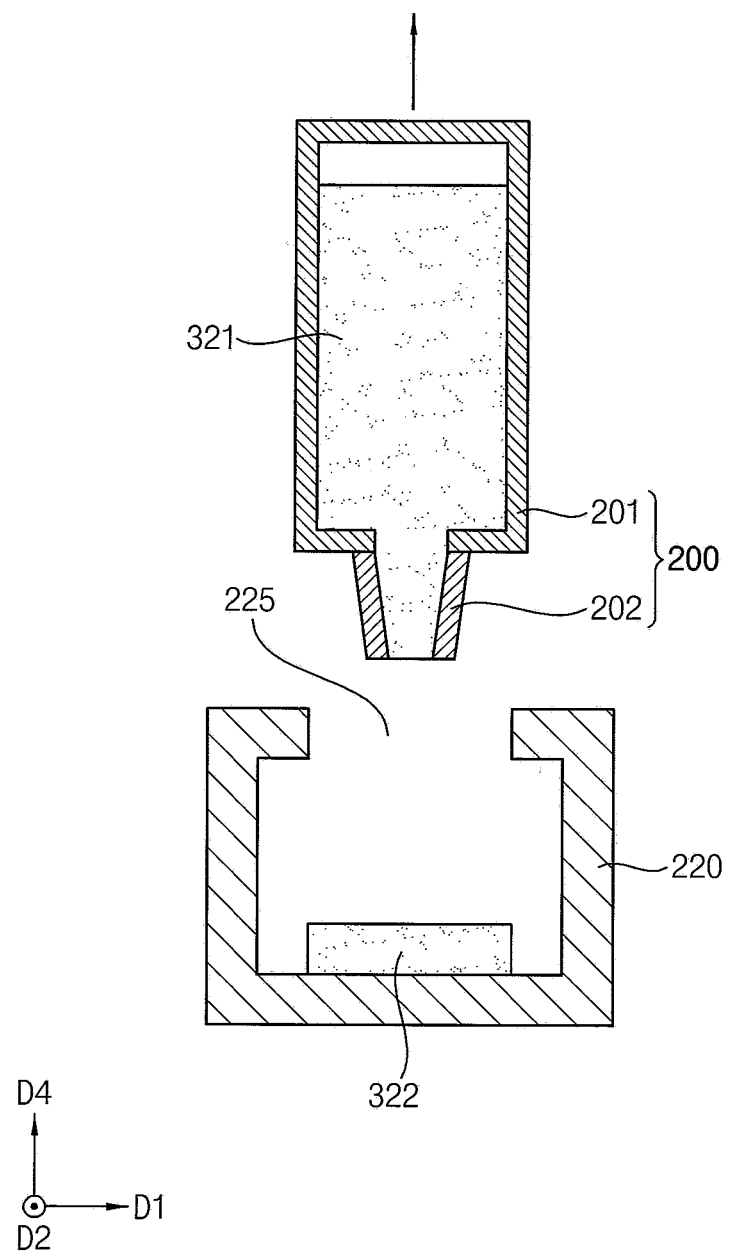

Referring to FIG. 19, the spray member 200 may be spaced apart from a top surface of the second suction member 220. For example, the spray member 200 may move in the fourth direction D4 such that the spray member 200, which comes into contact (e.g., direct contact) with the second suction member 220 through the moving member connected to the spray member 200, may be spaced apart from the second suction member 220.

Figure 20:
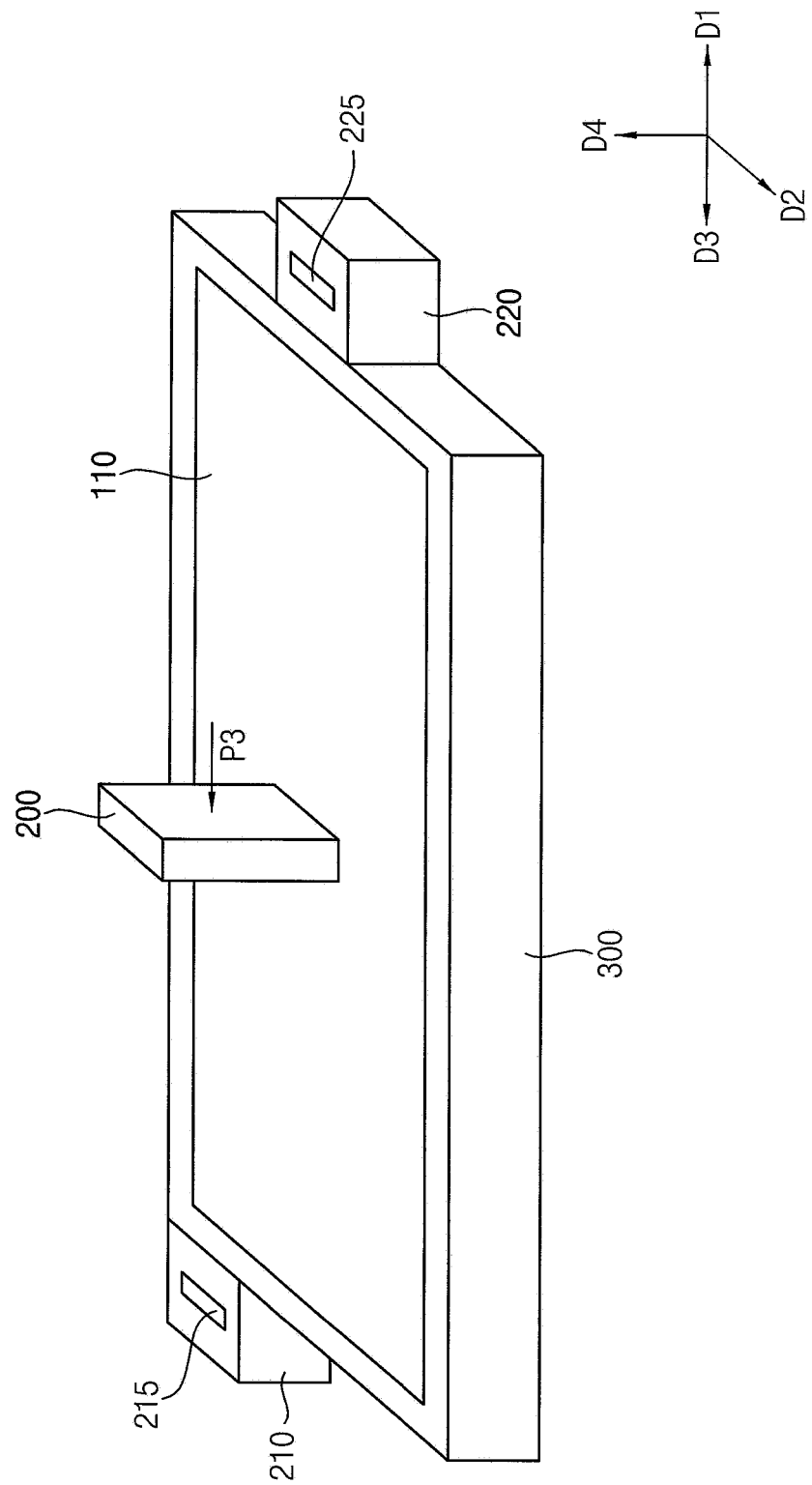
Figure 21:
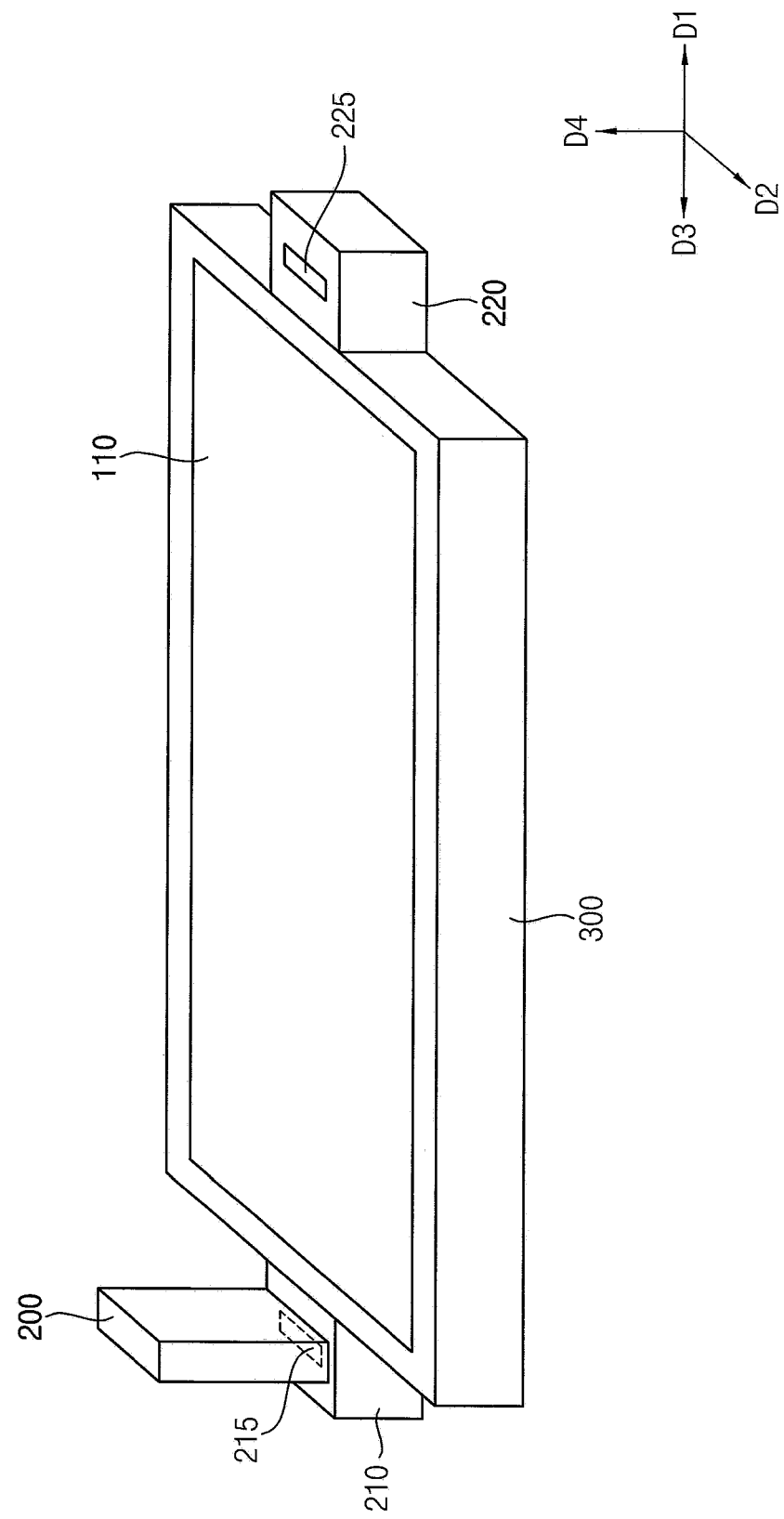

Referring to FIGS. 17, 20 and 21, the first suction member 210 may move in the second direction D2. The spray member 200 may move from a position above the second suction member 220 to a position above the first suction member 210 along a third direction D3 opposite to the first direction D1 via the second portion of the substrate 110. The moving path may be defined as a third path P3. While the spray member 200 moves along the third path P3, the first ink 321 stored in the body 201 of the spray member 200 and having the desired (e.g., predetermined) viscosity may be discharged to the second portion of the substrate 110. After locating or moving above the first suction member 210, the spray member 200 may move in a direction opposite to the fourth direction D4, and may come into contact (e.g., direct contact) with the top surface of the first suction member 210.

In the above manner, the spray member 200 may perform the printing process entirely on the substrate 110. The discharge failure may not occur during performing the printing process.

Figure 22:
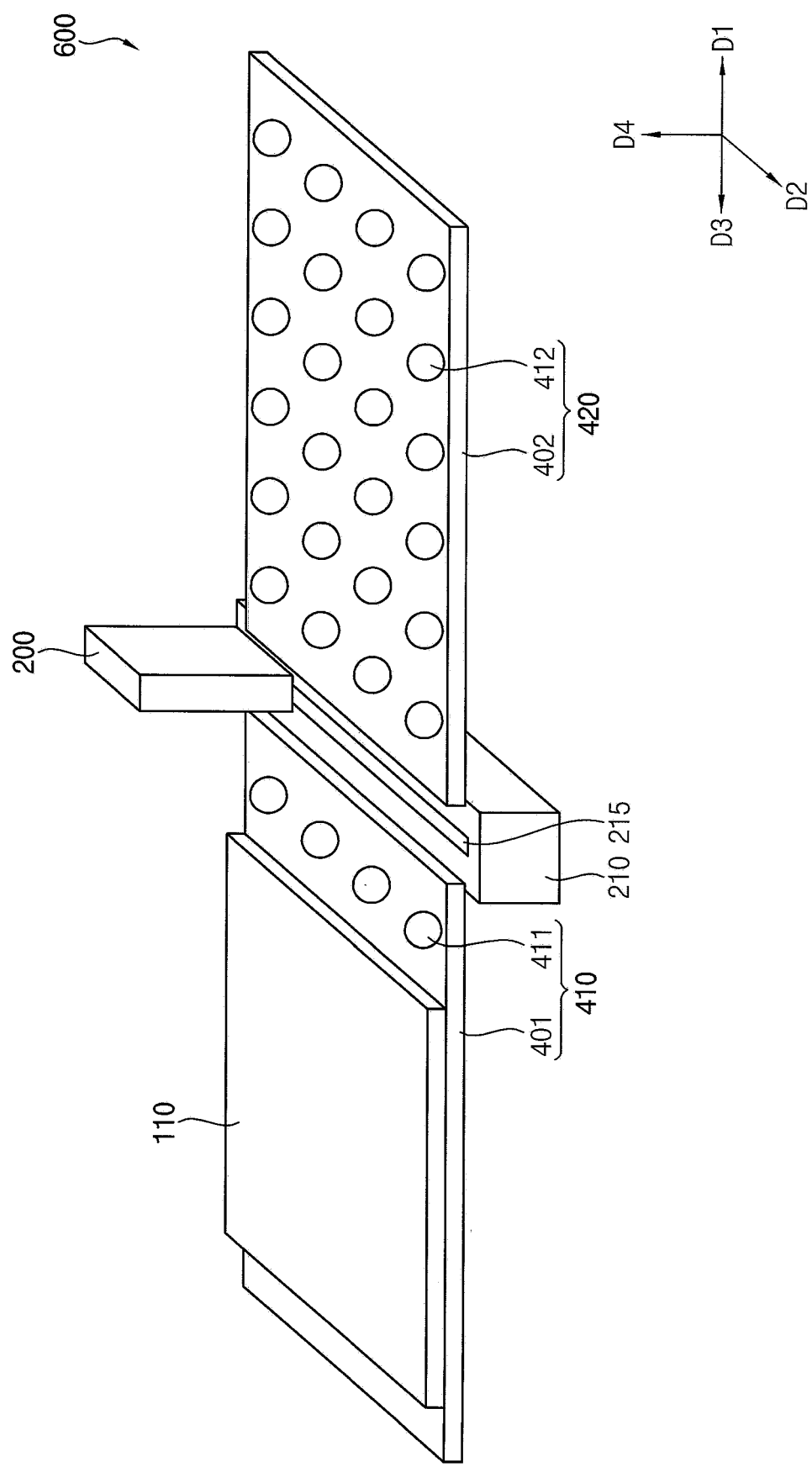
FIG. 22 is a perspective view showing the inkjet device according to one or more embodiments of the present invention.

FIG. 22 is a perspective view showing the inkjet device according to one or more embodiments of the present invention. The inkjet device 600 illustrated in FIG. 22 may have a configuration substantially the same as or similar to the inkjet device 100 described with reference to FIGS. 1 and 2, except for a location of the suction member 210, a first air floating structure 410, and a second air floating structure 420. In FIG. 22, duplicate descriptions for components substantially the same as or similar to the components described with reference to FIGS. 1, 2 and 7 may be omitted.

Referring to FIGS. 2 and 22, the inkjet device 600 may include a suction member 210, a first air floating structure 410, a second air floating structure 420, a spray member 200, and the like. The spray member 200 may include a body 201 and a nozzle 202. In one or more embodiments, ink 320 may be stored in the spray member 200. For example, the ink 320 may include a first ink 321 stored in the body 201 and a second ink 322 located inside the nozzle 202. In addition, the first air floating structure 410 may include a first plate 401 and one or more first air discharge members 411, and the second air floating structure 420 may include a second plate 402 and one or more second air discharge members 412.

The first air floating structure 410 may be located on a left side of the suction member 210, and the second air floating structure 420 may be located on a right side of the suction member 210. A plurality of first air discharge members 411 may be disposed on the first plate 401, and the first air discharge members 411 may discharge air. A substrate 110 including a glass substrate or a plastic substrate may be located on or above the first air floating structure 410, and the ink 320 discharged from the spray member 200 may be printed on the substrate 110. In addition, a plurality of second air discharge members 412 may be disposed on the second plate 402, and the second air discharge members 412 may discharge air.

The spray member 200 may be located or moved above a first portion of the suction member 210. The suction member 210 may move in the fourth direction D4, so that the nozzle 202 of the spray member 200 may be located inside (e.g., at a position inside) a groove 215 of the suction member 210 (see FIG. 23). The spray member 200 may come into contact (e.g., direct contact) with a top surface of the suction member 210. As shown in FIG. 2, the spray member 200 may include a body 201 and a nozzle 202. One portion of an upper surface of the body 201 may be connected to a moving member, and another portion of the upper surface of the body 201 may be connected to an ink supplying unit. In one or more embodiments, when the ink 320 is discharged to the nozzle 202, ink may be replenished to the body 201 through the ink supply unit. The spray member 200 may move in the second direction D2 through the moving member connected to the spray member 200.

The suction member 210 may be interposed between the first air floating structure 410 and the second air floating structure 420. The suction member 210 may include a groove 215. In one or more embodiments, the suction member 210 may be connected to the moving member, and may move in the fourth direction D4 and a direction opposite to the fourth direction D4 through the moving member. The suction member 210 may move in the fourth direction D4, so that the nozzle 202 of the spray member 200 may be located inside (e.g., at a position inside) the groove 215, and the spray member 200 may come into contact (e.g., direct contact) with the suction member 210. For example, the suction member 210 may suck the second ink 322 located in the nozzle 202 of the spray member 200. In addition, a length of the suction member 210 in the second direction D2 may be longer (greater) than a length of the spray member 200 in the second direction D2, and may be substantially the same as or the same as (equal to) a length of the first air floating structure 410 or the second air floating structure 420 in the second direction D2. In one or more embodiments, the suction member 210 may have a first opening instead of the groove 215. In addition, the suction member 210 may come into contact (e.g., direct contact) with the spray member 200 and not suck the second ink 322 located in the nozzle 202 of the spray member 200. Instead, the spray member 200 may discharge the second ink 322 located in the nozzle 202 so that the second ink 322 may be stored in the groove 215. In one or more embodiments, the suction member 210 may function as a moving member for moving the spray member 200 in the second direction D2. In this case, a length of the suction member 210 in the second direction D2 may be longer (greater) than a length of the spray member 200 in the second direction D2, and may be shorter (less) than a length of the first air floating structure 410 or the second air floating structure 420 in the second direction D2.

The suction member 210 may move in a direction opposite to the fourth direction D4 such that the suction member 210, which comes into contact (e.g., direct contact) with the spray member 200 through the moving member connected to the suction member 210, may be spaced apart from the spray member 200, and the substrate may pass through a space between the suction member 210 and the nozzle 202.

In one or more embodiments, the suction member 210 may move in the fourth direction D4 and the direction opposite to the fourth direction D4, but may not move in the first direction D1, the second direction D2, and the third direction D3. In addition, the spray member 200 may move in the second direction D2, but may not move in the first direction D1, the third direction D3, the fourth direction D4, and the direction opposite to the fourth direction D4.

In one or more embodiments, when the substrate 110 is located on the first air floating structure 410, the substrate 110 may move between the suction member 210 and the nozzle 202 along the first direction D1, and the ink 320 discharged from the spray member 200 may be printed on a first portion of the substrate 110. The spray member 200 may move in the second direction D2 after the substrate 110 moves from the first air floating structure 410 to the second air floating structure 420. In addition, when the substrate 110 is located on the second air floating structure 420, the substrate 110 may move between the suction member 210 and the nozzle 202 along the third direction D3, and the ink 320 discharged from the spray member 200 may be printed on a second portion of the substrate 110.

In one or more embodiments, when the substrate 110 is located on the first air floating structure 410, the spray member 200 may discharge the first ink 321 stored in the body 201 to the first portion of the substrate 110, after the suction member 210 comes into contact (e.g., direct contact) with the spray member 200 and the suction member 210 sucks the second ink 322 located inside the nozzle 202. In addition, when the substrate 110 is located on the second air floating structure 420, the spray member 200 may discharge the first ink 321 stored in the body 201 to the second portion of the substrate 110, after the suction member 210 comes into contact (e.g., direct contact) with the spray member 200 and the suction member 210 directly sucks the second ink 322 located inside the nozzle 202.

In one or more embodiments, the spray member 200 may discharge the first ink 321 stored in the body 201 to the first and second portions of the substrate 110, after the suction member 210 comes into contact (e.g., direct contact) with the spray member 200 and the spray member 200 sucks the second ink 322 located inside the nozzle 202. Accordingly, the first ink 321 having a desired (e.g., predetermined) viscosity is discharged to the first and second portions of the substrate 110, so that the inkjet device 600 may function as a printing device configured to prevent or to reduce the discharge failure.

Figure 23:
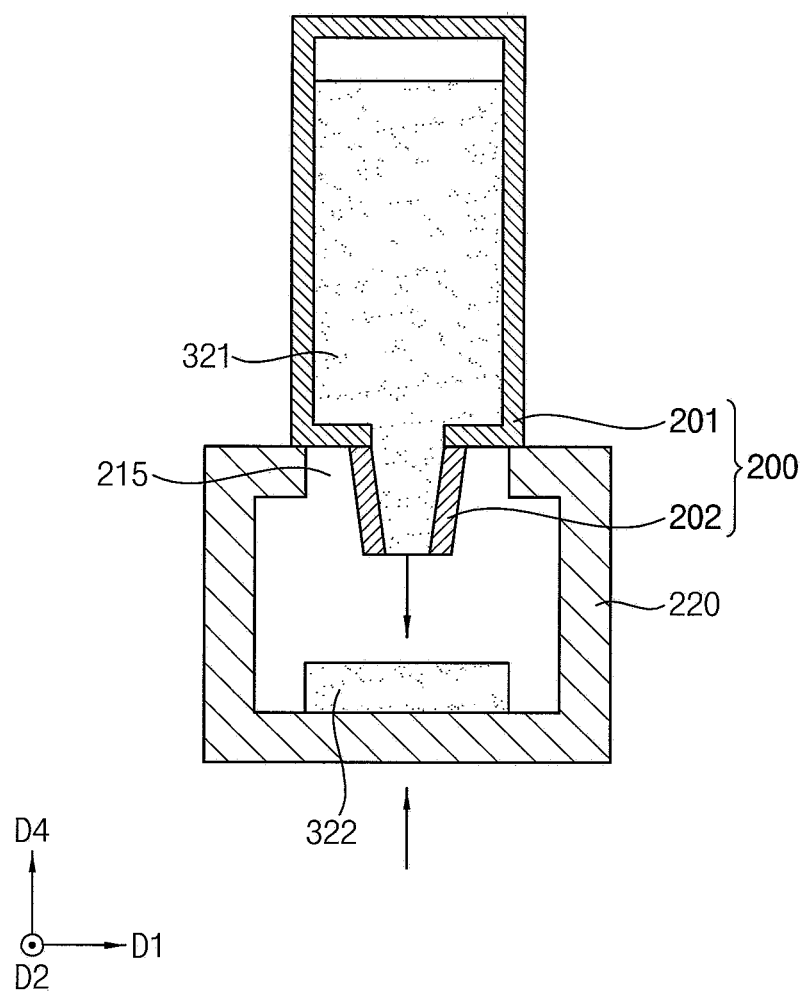
Figure 24:
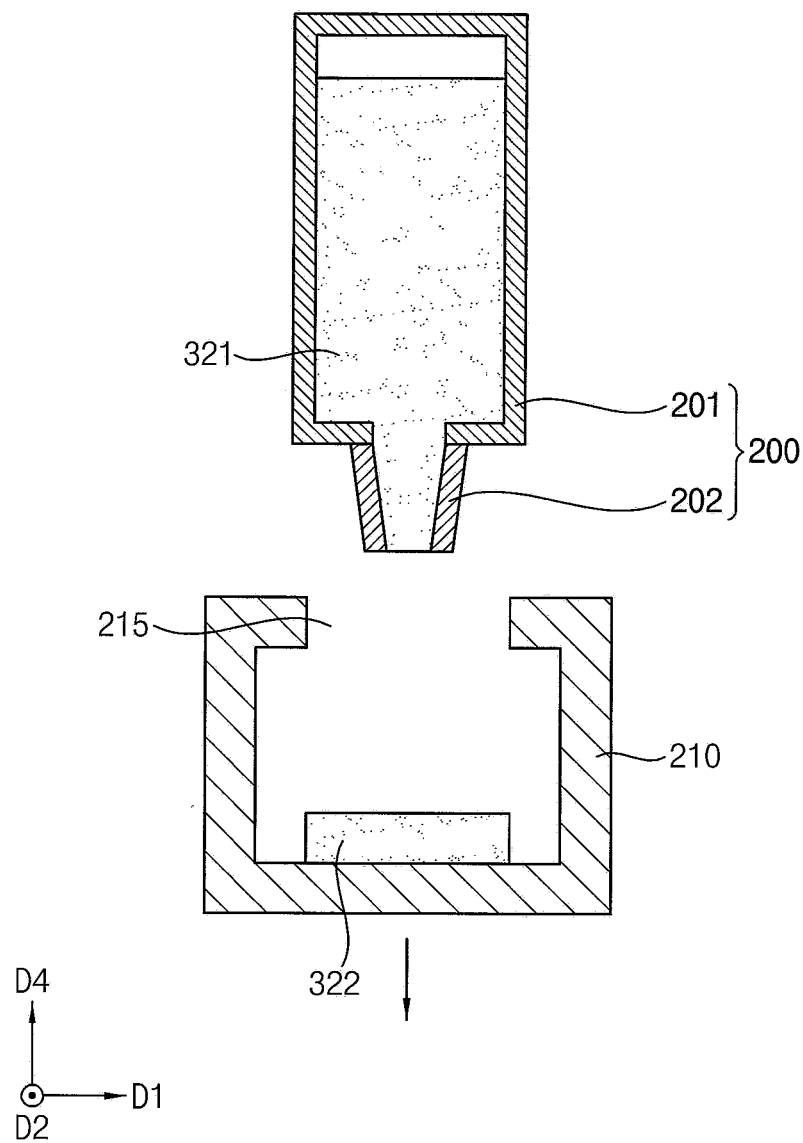

FIGS. 23-29 are views showing a printing method of the inkjet device according to one or more embodiments of the present invention. For example, FIGS. 23 and 24 are sectional views illustrating the spray member and the suction members. FIGS. 25, 26, 27, 28, and 29 are perspective views showing moving paths of the substrate and the spray member.

Referring to FIGS. 2 and 22, the substrate 110 may be located on the first air floating structure 410, and the spray member 200 may be located or moved above a first portion of the suction member 210. The suction member 210 may move in the fourth direction D4, so that the spray member 200 may be located inside (e.g., at a position inside) the groove 215 of the suction member 210. When the spray member 200 is located inside (e.g., at a position inside) the groove 215 of the suction member 210, the first ink 321 and the second ink 322 may be stored in the body 201 and the nozzle 202 of the spray member 200, respectively. In one or more embodiments, the act of locating or moving the spray member 200 inside the groove 215 may be defined as not-performing a printing process. In one or more embodiments, a length of the suction member 210 in the second direction D2 may be longer (greater) than a length of the spray member 200 in the second direction D2, and may be substantially the same as or the same as (equal to) a length of the first air floating structure 410 or the second air floating structure 420 in the second direction D2.

Referring to FIGS. 22 and 23, the suction member 210 may suck the second ink 322 located in the nozzle 202 of the spray member 200. Accordingly, the second ink 322 discharged from the spray member 200 may be located inside the suction member 210, and the first ink 321 may be located in the nozzle 202 of the spray member 200.

In one or more embodiments, the ink 320 may not be discharged from the nozzle 202 while the printing process is not performed. In this case, the second ink 322 located inside the nozzle 202 may be stagnant and a portion of the second ink 322 may be exposed to the outside. Thus, a solvent of the second ink 322 may evaporate which may cause the viscosity of the second ink 322 to increase. If the printing process is not performed for a sufficient period of time, a film may be form at a portion where the second ink 322 is exposed from the nozzle 302. When the viscosity of the second ink 322 increases or the film is formed, a discharge failure may occur in which the second ink 322 is not discharged to a portion where the printing process starts on the substrate 110. In addition, even if the second ink 322 is discharged, a discharging direction of the second ink 322 may be distorted, thereby failing to print at an accurate printing location. In one or more embodiments, the first suction member 210 may suck the second ink 322 located inside the nozzle 202 before the printing process is performed, so that the discharge failure may be prevented or be reduced.

Referring to FIG. 24, the suction member 210 may be spaced apart from the spray member 200. For example, the suction member 210 may move in the direction opposite to the fourth direction D4 such that the suction member 210, which comes into contact (e.g., direct contact) with the spray member 200 through the moving member connected to the suction member 210, may be spaced apart from the spray member 200.

Figure 25:
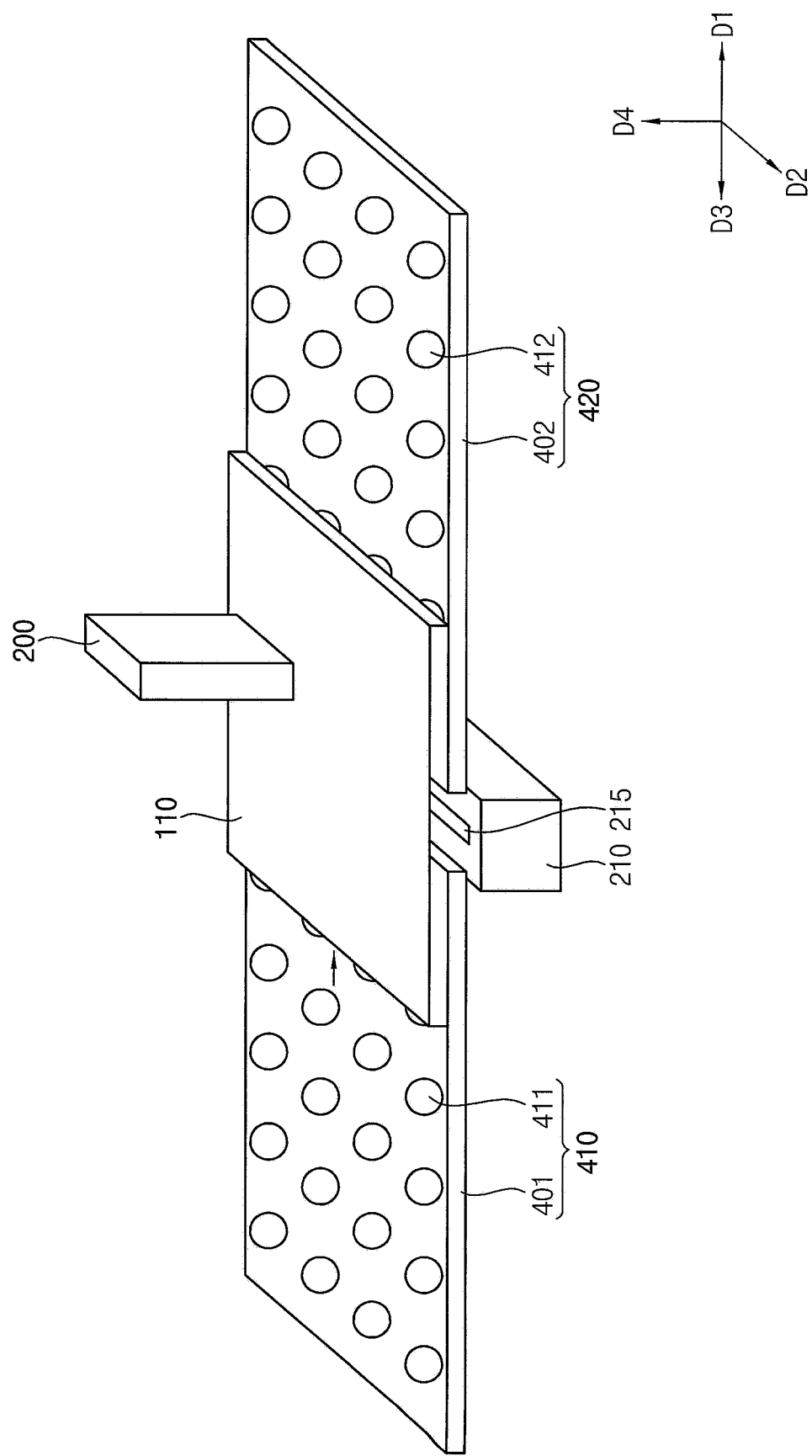
Figure 26:
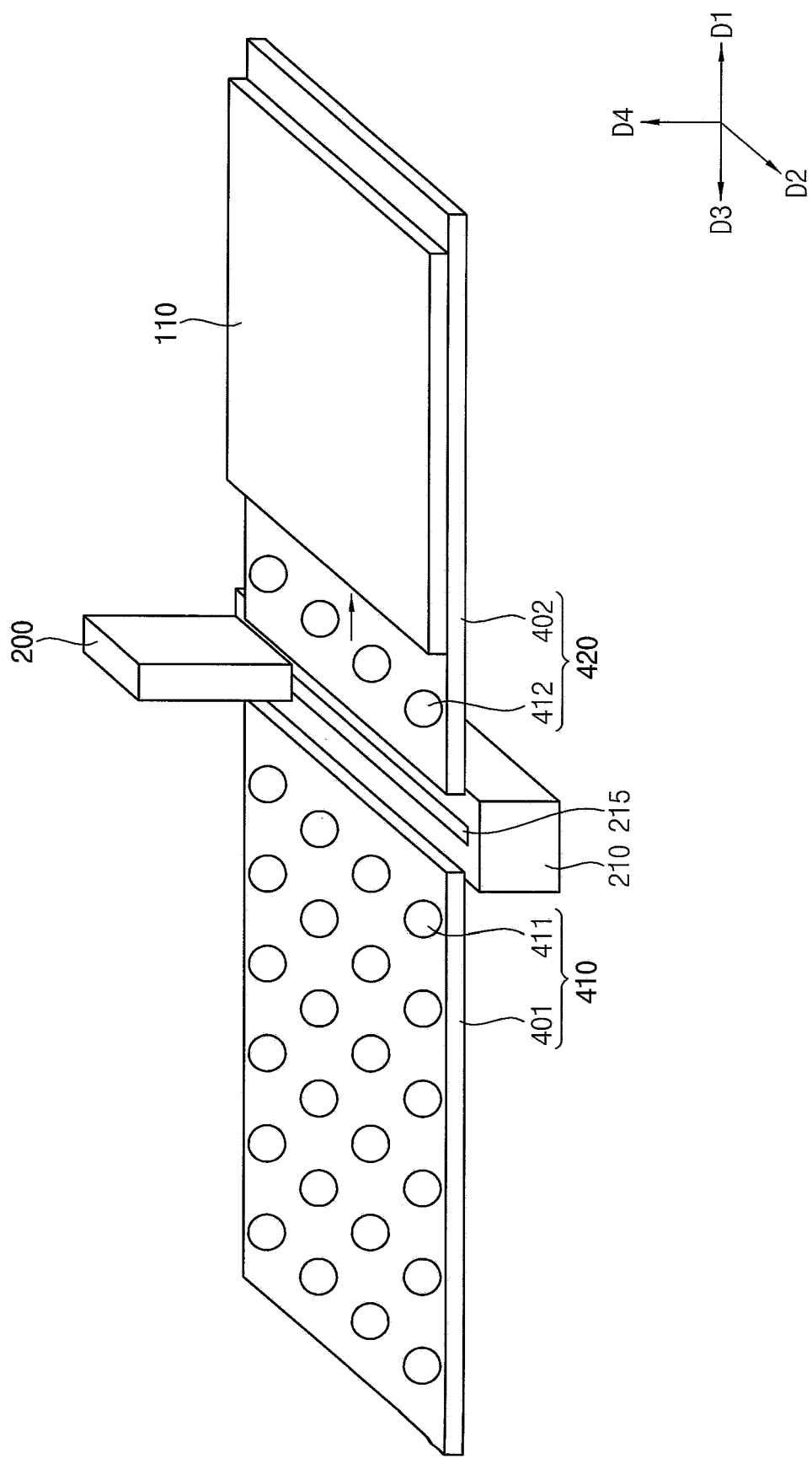
Figure 27:
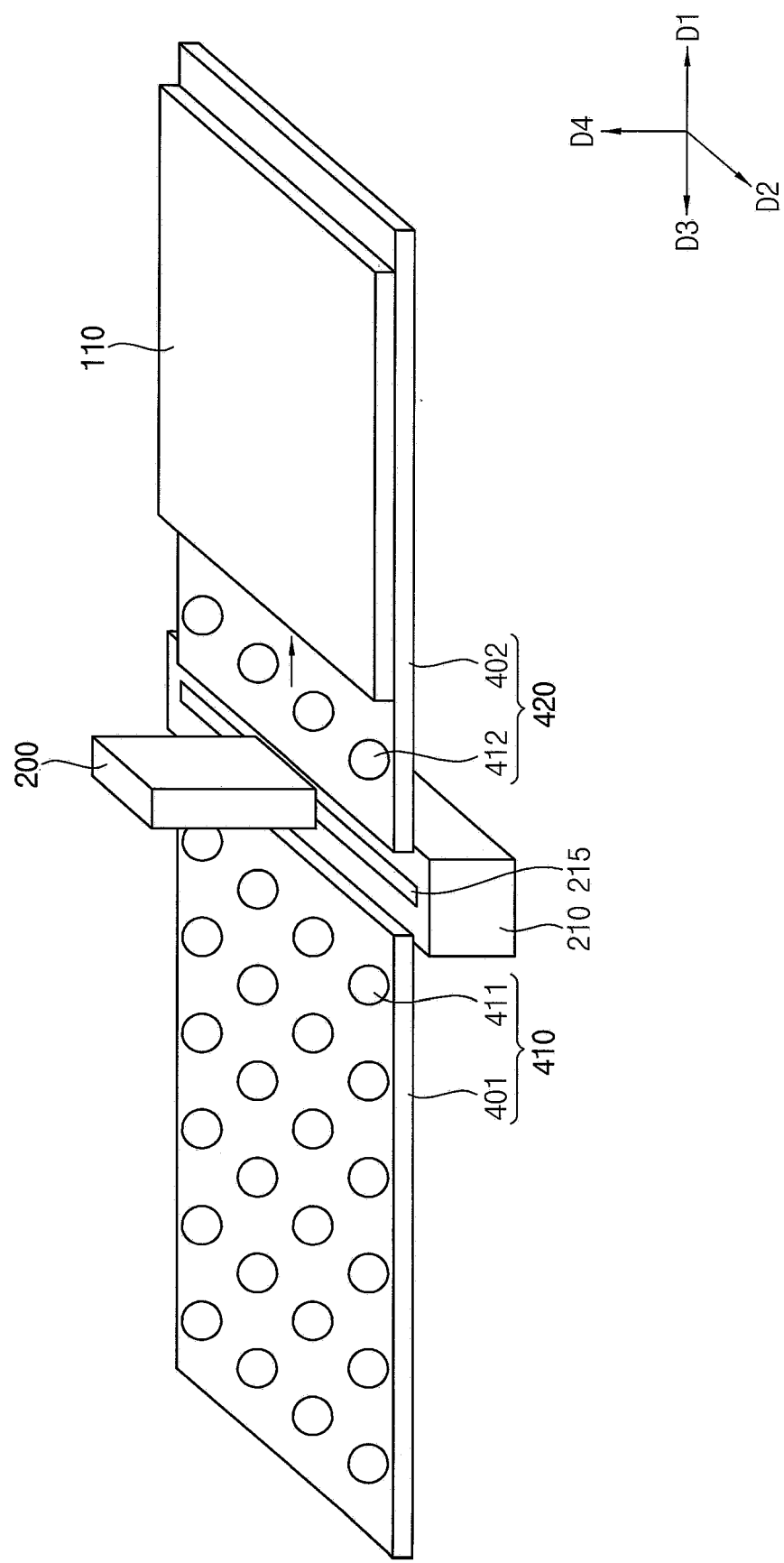

Referring to FIGS. 25 and 26, when the substrate 110 is located on the first air floating structure 410, the substrate 110 may move between the suction member 210 and the nozzle 202 along the first direction D1, and the first ink 321 stored in the body 201 may be discharged to a first portion of the substrate 110. Referring to FIGS. 26 and 27, after the substrate 110 moves from the first air floating structure 410 to the second air floating structure 420, the spray member 200 located on the first portion of the suction member 210 may move to a second portion of the suction member 210 along the second direction D2. After the spray member 200 moves to a position above the second portion of the suction member 210, the suction member 210 may move in the fourth direction D4. The top surface of the suction member 210 may come into contact (e.g., direct contact) with spray member 200, and the nozzle 202 may be located inside (e.g., at a position inside) the groove 215. When the spray member 200 is located inside (e.g., at a position inside) the groove 215 of the suction member 210, the first ink 321 and the second ink 322 may be stored in the body 201 and the nozzle 202 of the spray member 200, respectively. In one or more embodiments, the act of locating or moving the spray member 200 inside the groove 215 may be defined as not-performing a printing process.

Referring to FIGS. 23 and 27, the suction member 210 may suck the second ink 322 located in the nozzle 202 of the spray member 200. Accordingly, the second ink 322 discharged from the spray member 200 may be located inside the suction member 210, and the first ink 321 may be located in the nozzle 202 of the spray member 200.

For example, while the spray member 200 moves from a position above the first portion of the suction member 210 to a position above the second portion, the ink 320 may not be discharged from the nozzle 202. In this case, the second ink 322 located inside the nozzle 202 may be stagnant. Thus, a solvent of the second ink 322 may evaporate which may cause the viscosity of the second ink 322 to increase. In one or more embodiments, the suction member 210 may suck the second ink 322 located inside the nozzle 202, so that the discharge failure may be prevented or be reduced.

Referring to FIG. 24, the suction member 210 may be spaced apart from the spray member 200. For example, the suction member 210 may move in the direction opposite to the fourth direction D4 such that the suction member 210, which comes into contact (e.g., direct contact) with the spray member 200 through the moving member connected to the suction member 210, may be spaced apart from the spray member 200.

Figure 28:
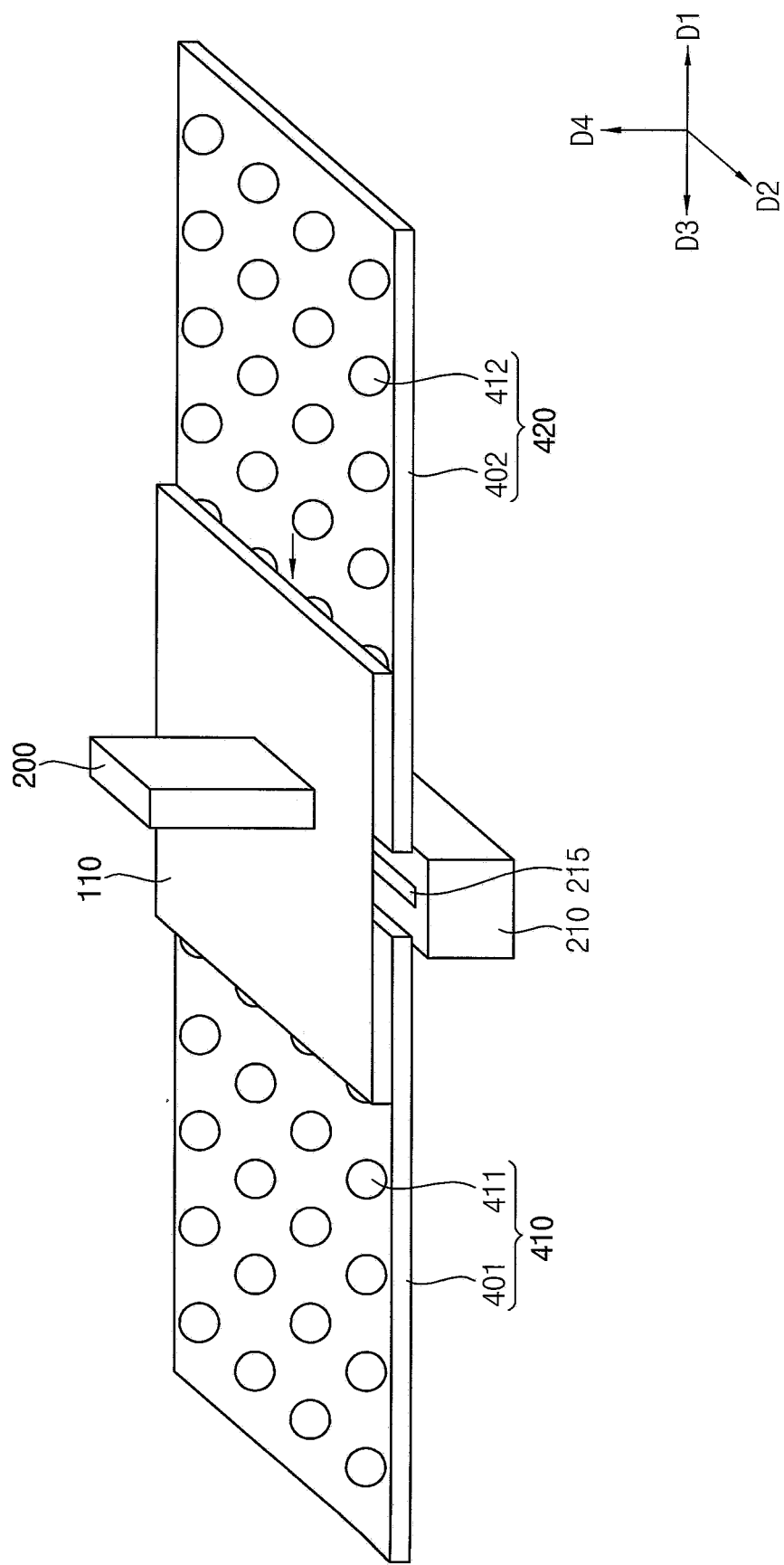

Referring to FIGS. 27, 28 and 29, when the substrate 110 is located on the second air floating structure 420, the substrate 110 may move between the suction member 210 and the nozzle 202 along the second direction D2, and the first ink 321 stored in the body 201 may be discharged to a second portion of the substrate 110.

The spray member 200 may perform the printing process entirely on the substrate 110 in the above manner, and the discharge failure may not occur or be reduced during performing the printing process.

The present invention may be applied to a method of manufacturing various display devices including a display device manufactured using an inkjet device. For example, the present invention may be applied to a manufacturing method of various display devices such as a vehicle-display device, a ship-display device, an aircraft-display device, portable communication devices, display devices for display or for information transfer, a medical-display device, etc.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept."

It will be understood that when an element or layer is referred to as being "on", "connected to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", or "immediately adjacent to" another element or layer, there are no intervening elements or layers present.

As used herein, the term "substantially" and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and equivalents thereof.

What is claimed is:

1. A printing method of an inkjet device, the printing method comprising:
    discharging ink of a spray member to a first portion of a substrate while the spray member moves in a first direction, in which the spray member comprises a body and a nozzle at a side of the body to discharge the ink;
    locating the spray member above a first portion of a second suction member, and then locating the spray member above a second portion of the second suction member by moving the spray member in a second direction orthogonal to the first direction;
    discharging the ink located inside the nozzle of the spray member to the second portion of the second suction member; and
    before discharging the ink of the spray member to the first portion of the substrate: locating the substrate on a stage; and locating the spray member above a first portion of a first suction member.

2. The printing method of claim 1, further comprising:
discharging the ink located inside the nozzle of the spray member to the first portion of the first suction member, after locating the spray member above the first portion of the first suction member.

3. The printing method of claim 2, wherein the ink discharged from the spray member to the first portion of the substrate is the ink stored in the body of the spray member, while the spray member is moving in the first direction after discharging the ink located inside the nozzle of the spray member.

4. The printing method of claim 1, wherein each length of the first and the second suction members in the second direction is longer than a length of the spray member in the second direction and equal to a length of the stage in the second direction, and the first suction member is opposite the second suction member.

5. A printing method of an inkjet device, the printing method comprising:
discharging ink of a spray member to a first portion of a substrate while the spray member moves in a first direction, in which the spray member comprises a body and a nozzle at a side of the body to discharge the ink;
locating the spray member above a first portion of a second suction member, and then locating the spray member above a second portion of the second suction member by moving the spray member in a second direction orthogonal to the first direction;
discharging the ink located inside the nozzle of the spray member to the second portion of the second suction member;
discharging the ink stored in the body of the spray member to a second portion of the substrate while the spray member is moving in a third direction opposite to the first direction, after discharging the ink located inside the nozzle of the spray member to the second portion of the second suction member; and
locating the spray member above a second portion of a first suction member.

6. A printing method of an inkjet device, the printing method comprising:
discharging ink of a spray member to a first portion of a substrate while the spray member moves in a first direction, in which the spray member comprises a body and a nozzle at a side of the body to discharge the ink;
locating the spray member above a second suction member comprising a second groove;
locating the nozzle of the spray member at a position inside of the second groove;
sucking the ink located inside the nozzle by utilizing the second suction member; and
moving the spray member in a second direction orthogonal to the first direction by utilizing the second suction member, after locating the nozzle of the spray member at the position inside of the second groove.

7. The printing method of claim 6, further comprising:
discharging the ink stored in the body of the spray member to a second portion of the substrate while the spray member is moving in a third direction opposite to the first direction, after sucking the ink located inside the nozzle utilizing the second suction member.

8. The printing method of claim 6, further comprising, before discharging the ink of the spray member to the first portion of the substrate:
locating the substrate on a stage; and
locating the spray member above a first suction member comprising a first groove.

9. The printing method of claim 8, further comprising, after locating the spray member above the first portion of the first suction member comprising the first groove:
locating the nozzle of the spray member at a position inside of the first groove; and
sucking the ink located inside the nozzle by utilizing the first suction member.

10. The printing method of claim 9, wherein the ink discharged from the spray member to the first portion of the substrate is the ink stored in the body of the spray member, while the spray member is moving in the first direction after the sucking the ink located inside the nozzle of the spray member.

* * * * *